US006788785B1

(12) United States Patent
Ding

(10) Patent No.: US 6,788,785 B1
(45) Date of Patent: *Sep. 7, 2004

(54) STABLE ADAPTIVE FILTER AND METHOD

(75) Inventor: Heping Ding, Kanata (CA)

(73) Assignee: Nortel Networks Limited, Quebec (CA)

( * ) Notice: Subject to any disclaimer, the term of this patent is extended or adjusted under 35 U.S.C. 154(b) by 0 days.

This patent is subject to a terminal disclaimer.

(21) Appl. No.: 09/356,041

(22) Filed: Jul. 16, 1999

Related U.S. Application Data

(63) Continuation-in-part of application No. 09/218,428, filed on Dec. 22, 1998.

(51) Int. Cl.[7] ............................................... H04M 9/08
(52) U.S. Cl. ............................... 379/406.08; 381/71.11; 708/322; 708/426; 370/465
(58) Field of Search ....................... 379/406.01, 406.08, 379/406.09, 142.04, 142.13; 381/71.1, 71.12, 71.14, 71.11; 708/322, 323, 426; 370/466.468

(56) References Cited

U.S. PATENT DOCUMENTS

| 5,428,562 A | | 6/1995 | Gay ....................... 364/724.19 |
| 5,568,411 A | | 10/1996 | Batruni |
| 5,677,951 A | * | 10/1997 | Gay ....................... 379/406.08 |
| 5,748,847 A | * | 5/1998 | Lo ............................... 706/14 |
| 5,901,059 A | * | 5/1999 | Tao et al. ...................... 700/29 |
| 5,995,620 A | * | 11/1999 | Wigren .................. 379/406.09 |
| 6,137,881 A | * | 10/2000 | Oh et al. ............... 379/406.08 |

FOREIGN PATENT DOCUMENTS

| EP | 0 684 706 A | 11/1995 |
| EP | 0 751 619 A | 1/1997 |

OTHER PUBLICATIONS

K.M. Tao "Statistical Average and PARTAN–some alternatives to LMS and RLS," IEEE Int. Conf. Acoustics, Speech and Signal Processing, 1992, pp. IV–25–IV–28.*

"On the Use of a Modified Fast Affine Projection Algorithm in Subbands for Acoustic Echo Cancelation", Liu, Q.G., et al, Proc. 1996 IEEE Digital Signal Processing Workshop, Loen, Norway, Sep. 1–4, 1996, pp. 354–7.

"The Fast Affine Projection Algorithm", Gay, S.L., et al, Processing of the International Conference on Acoustics, Speech and Signal Processing, Detroit, Michigan, USA, May 1995, pp. 3023–26.

Kazuhiko, O., et al, "An Adaptive Filtering Algorithm Using An Orthogonal Projection to an Affine Subspace and its Properties", Electronics and Communications in Japan, US, Scripta Technica, New York, vol. 67–A, No. 5, May 1/84, pp. 19–27.

* cited by examiner

*Primary Examiner*—Minsun Oh Harvey
*Assistant Examiner*—Con P. Tran

(57) ABSTRACT

A Fast Affine Projection (FAP) adaptive filter and method of adaptive filtering are disclosed, which reduce instability associated with FAP filters caused by error accumulation in the process of inversion of an autocorrelation matrix. The method provides updating of the adaptive filter coefficients by solving at least one system of linear equations whose coefficients are the autocorrelation matrix coefficients, by using a descending iterative method with intrinsic feedback. The results of the solution are used to update the adaptive filter coefficients. The approach is applicable for a normalized step size ranging from zero to unity, and allows either direct determination of updated filter coefficients without determining an inverse autocorrelation matrix, or, determining the inverse autocorrelation matrix by a descending iterative method. In some embodiments, a normalized step size is set close to unity, and the system of linear equations is solved by steepest descent or conjugate gradients methods. In other embodiments, a normalized step size is substantially less than unity, e.g. less than about 0.7. Accumulation of inevitable numerical errors is avoided and the stable adaptive filter and method are suitable for various DSP platforms, e.g. 16 and 24 bit, fixed-point and floating-point platforms.

80 Claims, 9 Drawing Sheets

STABLE ADAPTIVE FILTER AND METHOD

This application is a continuation-in-Part of U.S. patent application Ser. No. 09/218,428 to Heping Ding filed Dec. 22, 1998 and incorporated herein by reference.

FIELD OF THE INVENTION

The present invention relates to adaptive filters, and in particular, to fast affine projection (FAP) adaptive filters providing a stability of operation, and methods of stable FAP adaptive filtering.

BACKGROUND OF THE INVENTION

Adaptive filtering is a digital signal processing technique that has been widely used in technical areas such as, e.g., echo cancellation, noise cancellation, channel equalization, system identification and in products like, e.g., network echo cancellers, acoustic echo cancellers for full-duplex hands-free telephones and audio conference systems, active noise control, data communications systems.

The characteristics of an adaptive filter are determined by its adaptation algorithm. The choice of the adaptation algorithm in a specific adaptive filtering system directly affects the performance of the system.

Being simple and easily stable, the normalized least mean square (NLMS) adaptation algorithm, being a practical implementation of the least mean square (LMS) algorithm, is now most widely used in the industry with a certain degree of success.

However, because of its intrinsic weakness, the NLMS algorithm converges slowly with colored training signals like the speech, an important class of signals most frequently encountered in many applications such as telecommunications. The performance of systems incorporating NLMS adaptive filters very often suffers from the slow convergence nature of the algorithm. Other known algorithms proposed so far are either too complicated to implement on a commercially available low-cost digital signal processor (DSP) or suffer from numerical problems. Recently, a fast affine projection (FAP) method was proposed as described in a publication by Steven L. Gay and Sanjeev Tavathia (Acoustic Research Department, AT&T Bell Laboratories), "The Fast Affine Projection Algorithm," pp. 3023–3026, Proceedings of the International Conference on Acoustics, Speech, and Signal Processing, May 1995, Detroit, Mich., U.S.A. The FAP is a simplified version of the more complicated, and therefore less practical, affine projection (AP) algorithm. With colored train signals such as the speech, the FAP usually converges several times faster than the NLMS, with only a marginal increase in implementation complexity.

However, a stability issue has been preventing FAP from being used in the industry. A prior art FAP implementation oscillates within a short period of time even with floating-point calculations. This results from the accumulation of finite precision numerical errors in a matrix inversion process associated with the FAP. Researchers have been trying to solve this problem, but no satisfactory answer has been found so far. A remedy proposed in the publication listed above and reinforced in publication by Q. G. Liu, B. Champagne, and K. C. Ho (Bell-Northern Research and INRS-Télécommunications, Université du Québec), "On the Use of a Modified Fast Affine Projection Algorithm in Subbands for Acoustic Echo Cancellation," pp. 354–357, Proceedings of 1996 IEEE Digital Signal Processing Workshop, Loen, Norway, September 1996, is to periodically re-start a new inversion process in parallel with the old one, and to use it to replace the latter so as to get rid of the accumulated numerical errors therein. While this can be a feasible solution for high-precision DSPs such as a floating-point processor, it is still not suitable for fixed-point DSP implementations because then the finite precision numerical errors would accumulate so fast that the re-starting period would have to be made impractically small, not to mention the extra complexity associated with this part of the algorithm.

Therefore there is a need in the industry for development of alternative adaptive filtering methods which would ensure stability of operation while providing fast convergence and reliable results.

SUMMARY OF THE INVENTION

It is an object of the present invention to provide an adaptive filter and a method of adaptive filtering which would avoid the afore-mentioned problems.

According to one aspect of the present invention there is provided a method of adaptive filtering, comprising the steps of:

(a) determining adaptive filter coefficients;
(b) defining a normalized step size;
(c) updating the filter coefficients, comprising:
   determining auto-correlation matrix coefficients from a reference input signal, and
   solving at least one system of linear equations whose coefficients are the auto-correlation matrix coefficients, the system being solved by using a descending iterative method having an inherent stability of its operation, the results of the solution being used for updating the filter coefficients and the number of systems of linear equations to be solved being dependent on the normalized step size;
(d) repeating the steps (b) and (c) required number of times.

Advantageously, determining of the auto-correlation matrix is performed recursively. The normalized step size may be chosen to be equal to any value from 0 to 1 depending on the application. In the majority of applications, it is often set to be close to unity or equal to unity. Conveniently, the normalized step size is within a range from about 0.9 to 1.0. Another convenient possibility is to set the normalized step size within a range from about 0.7 to 1.0. For the normalized step size close to unity, the step of solving at least one system of linear equations comprises solving one system of linear equations only. Alternatively, in some applications, e.g., when one needs to keep misadjustment low after convergence, it is required to set the normalized step size substantially less than unity, e.g. less than about 0.7. In this situation the step of solving at least one system of linear equations comprises solving N systems of linear equations, with N being a projection order.

In the embodiments of the invention, a problem of finding the inverse of an auto-correlation matrix which is inherent for other known methods, is reduced to a problem of solving a system of linear equations based on the auto-correlation matrix. The system is solved by one of descending iterative methods which provide inherent stability of operation due to an intrinsic feedback adjustment. As a result inevitable numerical errors are not accumulated. In first and second embodiments of the invention, a steepest descent and conjugate gradient methods are used respectively to determine the first column of the inverse auto-correlation matrix, taking into account that the normalized step size is close to unity. In a third embodiment of the invention a steepest descent or conjugate gradient method is used to determine coefficients of the inverse auto-correlation matrix by recursively solving N systems of linear equations having decrementing orders. It corresponds to the case of the normalized step size being not close to unity. The forth embodiment of the invention avoids determining the inverse of the auto-correlation matrix. Instead, a system of linear equations is solved by using a conjugate gradient method resulting in a solution that can be used directly to determine an updating part of the filter coefficients. Alternatively, other known descending methods, e.g. steepest descent, Newton's method, PARTAN, quasi-Newton's method or other known iterative descending methods may also be used. Conveniently, the steps of the method may be performed by operating with real value or complex value numbers.

The method described above is suitable for a variety of applications, e.g. echo cancellation, noise cancellation, channel equalization, system identification which are widely used in products such as network echo cancellers, acoustic echo cancellers for full-duplex handsfree telephones and audio conference systems, active noise control systems, data communication systems.

According to another aspect of the invention there is provided an adaptive filter, comprising:
a filter characterized by adaptive filter coefficients;
    means for updating the filter coefficients, including means for setting a normalized step size, the updating means comprising:
        a correlator for determining auto-correlation matrix coefficients from a reference input signal, and
        a calculator for solving at least one system of linear equations whose coefficients are the auto-correlation matrix coefficients, the system being solved by using a descending iterative method having an inherent stability of its operation, the results of the solution being used for updating the filter coefficients and the number of systems of linear equations to be solved being dependent on the normalized step size.

Advantageously, the calculator is an iterative calculator. Preferably, the calculator is a steepest descent or a conjugate gradient calculator. Alternatively, it may be a calculator performing a Newton's or quasi-Newton's method, a PARTAN calculator, or another known iterative descending calculator providing an inherent stability of operation.

Conveniently, the filter and the updating means are capable of operating with real numbers. Alternatively, they may be capable of operating with complex numbers.

The normalized step size may be chosen to be equal to any value from 0 to 1 depending on the application. In the majority of applications, the adaptive filter is often set with the normalized step size close to unity or equal to unity. Conveniently, the normalized step size is within a range from about 0.9 to 1.0. Another convenient possibility is to set the normalized step size within a range from about 0.7 to 1.0. For the normalized step size close to unity, the calculator provides iterative solution of one system of linear equations only at each time interval. Alternatively, in some applications, e.g., when one needs to keep misadjustment after convergence low, it is required to set the normalized step size substantially less than unity, e.g. less than about 0.7. In this situation the calculator provides solutions of N systems of linear equations, with N being a projection order. Conveniently, due to the symmetry of the auto-correlation matrix, determining of the inverse auto-correlation matrix may be performed by solving N systems of linear equations having decrementing orders.

The adaptive filter as described above may be used for echo cancellation, noise cancellation, channel equalization, system identification or other applications where adaptive filtering is required.

The adaptive filter and method described above have an advantage over known FAP adaptive filters by providing a stability of operation. The problem caused by error accumulation in matrix inversion process existing in known FAP filters is solved in the present invention by using iterative descending methods. First, the matrix inversion operation is reduced to a solution of a corresponding system of linear equations based on the auto-correlation matrix. Second, the iterative descending methods, used for the solution of the above system, provide an inherent stability of operation due to an intrinsic feedback adjustment. As a result, inevitable numerical errors are not accumulated, thus providing stability of adaptive filtering.

BRIEF DESCRIPTION OF THE DRAWINGS

The invention will now be described in greater detail regarding the attached drawings in which.

DETAILED DESCRIPTION OF THE PREFERRED EMBODIMENTS

A. Conventions in Linear Algebra Representation

In this document, underscored letters, such as $\underline{d}(n)$ and $\underline{X}(n)$, stand for column vectors, and bold-faced ones, like $X(n)$, are matrices. $\underline{\bar{d}}(n)$ stands for an N−1 vector consisting of the N−1 upper most elements of the N vector $\underline{d}(n)$, and $\underline{\underline{d}}(n)$ stands for an N−1 vector consisting of the N−1 lower most elements of the N vector $\underline{d}(n)$. A superscript "T" stands for the transposition of a matrix or vector.

B. Introduction

Figure 1:
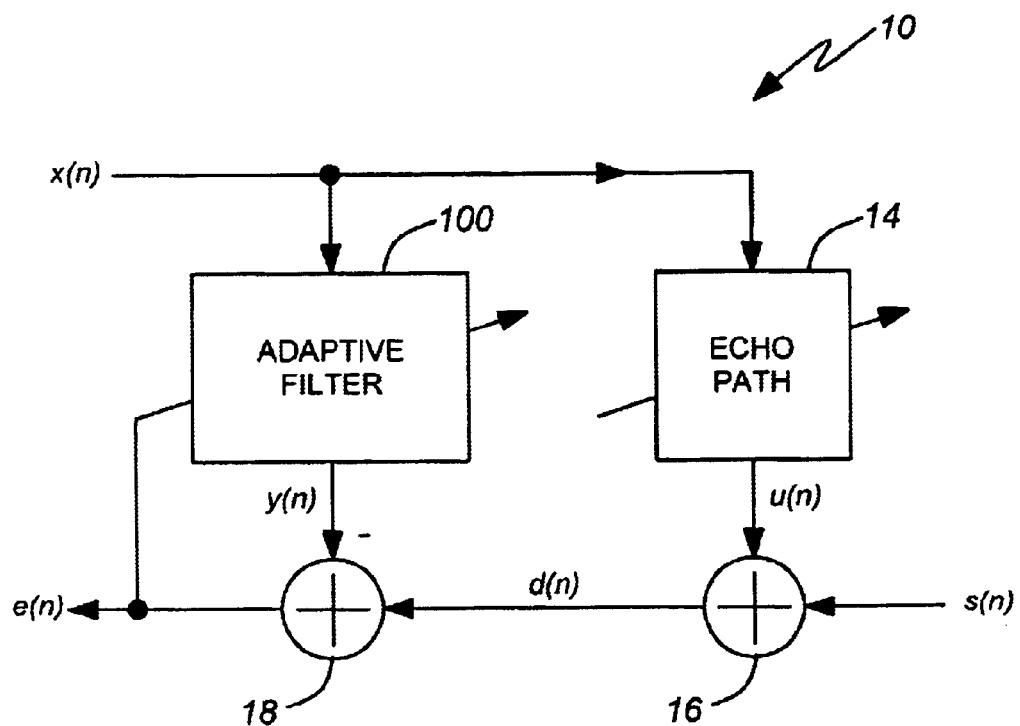
FIG. 1 is a block diagram of an adaptive echo cancellation system.

FIG. 1 presents a block diagram of an adaptive echo cancellation system 10 with an embedded adaptive filter 100, the echo cancellation being chosen as an exemplary representation of a wide class of adaptive filtering applications. A digitally sampled far-end reference input signal x(n) is supplied to the adaptive filter 100 and to an echo path 14 producing an unwanted signal u(n), the signal being an echo of x(n) through the echo path 14. The echo path 14 can be either a long electrical path, e.g. In a telecommunication network, or an acoustical path, e.g. In a room. An echo canceller may be used together with a telecomminication network switch or a speaker phone. The unwanted signal u(n) is mixed up with the wanted near-end signal s(n) in a summer 16 to produce a response signal d(n). The response signal d(n) is sent to another summer 18 together with an echo estimate signal y(n) generated by the adaptive filter 100. The summer 18 subtracts y(n) from d(n) producing an output signal e(n), to be transmitted to the far-end. Since the echo path is constantly changing, the adaptive filter must be able to continuously adapt to the new echo path. Therefore the goal is to produce the echo estimate signal y(n) as close to u(n) as possible, so that the latter is largely cancelled by the former, and e(n) best resembles s(n). The output signal e(n), called the error signal, is then transmitted to the far-end and also sent to the adaptive filter 100 which uses it to adjust its coefficients.

Note that, depending on a particular application, the terms "far-end" and "near-end" may need to be interchanged. For example, with a network echo canceller in a telephone terminal, x(n) in FIG. 1 is actually the near-end signal to be transmitted to the far-end, and d(n) in FIG. 1 is the signal received from the telephone loop connected to the far-end. Although the terminology used above is based on the assumption that x(n) is the far-end signal and d(n) is the signal perceived at the near-end, it is done solely for convenience and does not prevent the invention from being applied to other adaptive filter applications with alternate terminology.

The following conventions in linear algebra representation are used throughout the text of the present patent. Underscored letters, such as $\underline{d}(n)$ and $\underline{X}(n)$, stand for column vectors, and bold-faced ones, like $X(n)$, are matrices. $\overline{\underline{d}}(n)$ stands for an N−1 vector consisting of the N−1 upper most elements of the N vector $\underline{d}(n)$, and $\underline{\tilde{d}}(n)$ stands for an N−1 vector consisting of the N−1 lower most elements of the N vector $\underline{d}(n)$. A superscript "T" stands for the transposition of a matrix or vector.

1. The Normalized Least Mean Square (NLMS) Filter

The following L-dimensional column vectors are defined as the reference input vector and the adaptive filter coefficient vector respectively, where L is the length of the adaptive filter:

$$\underline{X}(n) \equiv \begin{bmatrix} x(n) \\ x(n-1) \\ \ldots \\ x(n-L+1) \end{bmatrix} \text{ and } \underline{W}(n) \equiv \begin{bmatrix} w_0(n) \\ w_1(n) \\ \ldots \\ w_{L-1}(n) \end{bmatrix} \quad \text{(Equation 1)}$$

The part for convolution and subtraction, which derives the output of the adaptive echo cancellation system, can then be expressed as $$e(n) = d(n) - y(n) = d(n) - \sum_{l=0}^{L-1} w_l(n)x(n-l) = d(n) - \underline{X}^T(n)\underline{W}(n) \quad \text{(Equation 2)}$$

where the superscript "T" stands for transpose of a vector or matrix. The adaptation part of the method, which updates the coefficient vectors based on the knowledge of the system behavior, is $$\underline{W}(n+1) = \underline{W}(n) + 2\mu(n)e(n)\underline{X}(n) \quad \text{(Equation 3)}$$

$$\mu(n) = \frac{\alpha}{\underline{X}^T(n)\underline{X}(n) + \delta}$$

In Equation (3), $\mu(n)$ is called the adaptation step size, which controls the rate of change to the coefficients, α is a normalized step size, and δ, being a small positive number, prevents $\mu(n)$ from going too big when there is no or little reference signal x(n).

The computations required in the NLMS filter include 2L+2 multiply and accumulate (MAC) operations and 1 division per sampling interval. Details about the least mean square (LMS) method can be found, e.g. In classical papers to B. Widrow, et al., "Adaptive Noise Cancelling: Principles and Applications," Proceedings of the IEEE, Vol. 63, pp. 1692–1716, Dec. 1975 and B. Widrow, et al., "Stationary and Nonstationary Learning Characteristics of the LMS Adaptive Filter," Proceedings of the IEEE, Vol. 64, pp. 1151–1162, Aug. 1976.

2. The Affine Projection (AP) Filter

The affine projection method is a generalization of the NLMS method. With N being a so-called projection order, we define $$\underline{d}(n) \equiv \begin{bmatrix} d(n) \\ d(n-1) \\ \ldots \\ d(n-N+1) \end{bmatrix}, \underline{e}(n) \equiv \begin{bmatrix} e(n) \\ e(n-1) \\ \ldots \\ e(n-N+1) \end{bmatrix}_{\underline{W}(n)} \quad \text{(Equation 4)}$$

$$X(n) = \begin{bmatrix} x(n) & x(n-1) & \ldots & x(n-N+1) \\ x(n-1) & x(n-2) & \ldots & x(n-N) \\ \ldots & \ldots & \ldots & \ldots \\ x(n-L+1) & x(n-L) & \ldots & x(n-N-L+2) \end{bmatrix}$$

where $\underline{d}(n)$ and $\underline{e}(n)$ are N vectors and $X(n)$ is an LxN matrix. Usually N is much less than L, so that $X(n)$ having more a "portrait" rather than a "landscape" shape. Note that $\underline{e}(n)$ in Equation (4) is the a priori error vector; all its elements, including e(n−1), . . . , e(n−N+1), depend on $\underline{W}(n)$, as indicated in Equation (5) below.

The convolution and subtraction part of the method is $$\underline{e}(n) = \underline{d}(n) - X^T(n)\underline{W}(n) \quad \text{(Equation 5)}$$

where $\underline{W}(n)$ is defined in Equation (1). The updating part of the method includes the following steps $$\underline{W}(n+1) = \underline{W}(n) + \alpha X(n)\underline{\varepsilon}(n) \quad \text{(Equation 6)}$$

$$R(n)\underline{\varepsilon}(n) = \underline{e}(n) \text{ or } \underline{\varepsilon}(n) = P(n)\underline{e}(n)$$

$$P(n) = R^{-1}(n)$$

$$R(n) \equiv X^T(n)X(n) + \delta I$$

where I is the NxN identity matrix, and α and δ play similar roles as described with regards to Equation 3. α is the normalized step size which may have a value from 0 to 1, and very often is assigned a unity value. δ is a regularization factor that prevents R(n), the auto-correlation matrix, from becoming ill-conditioned or rank-deficient, in which case P(n) would have too big eigenvalues causing instability of the method. It can be seen that an NxN matrix inversion operation at each sampling interval is needed in the AP method.

The AP method offers a good convergence property, but computationally is very extensive. It needs $2LN+O(N^2)$ MACs at each sampling interval. For example, for N equal to 5, which is a reasonable choice for many practical applications, the AP is more than 5 times as complex as the NLMS.

3. The Fast Affine Projection (FAP) Filter

Since the AP method is impractically expensive computationally, certain simplifications have been made to arrive at the so-called FAP method, see, e.g. U.S. Pat. No. 5,428,562 to Gay. Note that here the "F", for "fast", means that it saves computations, not faster convergence. In fact by adopting these simplifications, the performance indices, including the convergence speed, will slightly degrade.

Briefly, the FAP method consists of two parts:

(a) An approximation which is shown in Equation (7) below and certain simplifications to reduce the computational load. The approximation in Equation (7) uses the scaled posteriori errors to replace the a priori ones in Equation (4):

$$\underline{e}(n) \approx \begin{bmatrix} e(n) \\ (1-\alpha)\underline{e}(n-1) \end{bmatrix} = \begin{bmatrix} e(n) \\ (1-\alpha)e(n-1) \\ (1-\alpha)^2 e(n-2) \\ \ldots \\ (1-\alpha)^{N-1} e(n-N+1) \end{bmatrix} \quad \text{(Equation 7)}$$

(b) The matrix inversion operation.

The matrix inversion may be performed by using different approaches. One of them is a so-called "sliding windowed fast recursive least square (FRLS)" approach, outlined in U.S. Pat. No. 5,428,562 to Gay, to recursively calculate the P(n) in Eq. 6. This results in a total requirement of computations to be 2L+14N MACs and 5 divisions. In another approach, the matrix inversion lemma is used twice to derive P(n) at sampling interval n, see, e.g. Q. G. Liu, B. Champagne, and K. C. Ho (Bell-Northern Research and INRS-Télécommunications, Université du Québec), "On the Use of a Modified Fast Affine Projection Algorithm in Subbands for Acoustic Echo Cancellation", pp. 354–357, Proceedings of 1996 IEEE Digital Signal Processing Workshop, Loen, Norway, September 1996. It assumes an accurate estimate P(n−1) to start with, then derives P(n) by modifying P(n−1) based on P(n−1) and knowledge of the new data $\underline{X}(n)$. The total computations needed for such a FAP system are $2L+3N^2+12N$ MACs and 2 divisions. Compared with the "sliding windowed" approach, this method offers a more accurate estimation for P(n) because a conventional recursive least square (RLS) algorithm is used, instead of a fast version of it which has inevitable degradations.

Note that, it always arrives at the most accurate and stable solution to solve the matrix inversion problem directly by using classical methods. However, these methods are too expensive computationally to implement on a real time platform. Therefore, various alternative approaches with much less complexity, such as the ones described above, are used. The above matrix inversion methods have no feedback adjustment. An accurate estimate of P(n) relies heavily on an accurate starting point P(n−1). If P(n−1) deviates from the accurate solution, the algorithm has no way of knowing that, and will still keep updating it based on it and the new $\underline{X}(n)$. This means that errors in P(n−1), if any, will very likely accumulate and be passed on to P(n),P(n+1),P(n+2), and so on, and therefore stay in the system forever. When P(n) deviates from the accurate value, so will the calculated $\epsilon(n)$, as shown in Equation (6). As a result, the first expression in Equation (6) shows that the coefficient vector $\underline{W}(n)$ will no longer be updated properly. That is, $\underline{W}(n)$ can be updated in wrong directions, causing the adaptive filtering system to fail. A proposed remedy is to periodically re-start a new inversion process, either sliding windowed FRLS or conventional RLS based, in parallel with the old one, and to replace the old one so as to get rid of the accumulated numerical errors in the latter. While this can be a feasible solution for high-precision DSPs such as a floating-point processor, it is still not suitable for fixed-point DSP implementations because then the finite precision numerical errors would accumulate so fast that the re-starting period would have to be made impractically short.

4. Stable Fast Affine Projection Filter with a Normilized Step Size Close or Equal to Unity Usually, for maximum convergence speed, the normalized step size $\alpha$, as indicated in Equation (6), is set to a value of unity, or less than but quite close to it. This is the case described in the publications and the U.S. Pat. No. 5,428,562 cited above. It indicates that in this case $\underline{e}(n)$ will have only one significant element, e(n) as the very first one. Thus, the calculation for $\underline{\epsilon}(n)$ (Eq. 6) reduces from the product between a matrix and a vector to that between a vector and a scalar, i.e.

$$\underline{\epsilon}(n) = e(n)\underline{P}(n) \quad \text{(Equation 8)}$$

where $\underline{P}(n)$ is the very first, i.e., left most, column of the matrix P(n). Typically, $\alpha$ is greater than 0.9 and less or equal to 1.0. It is also indicated in the publication to Q. G. Liu cited above that, even with an $\alpha$ slightly less than that range, say about 0.7, the approximation is still acceptable. Thus, one only needs to calculate N, rather than all the $N^2$, elements of P(n).

In light of the above, the problem of finding P(n), the inverse of the auto-correlation matrix $$R(n) \equiv X^T(n)X(n) + \delta I \quad \text{(Equation 9)}$$

reduces to solving a set of N linear equations $$R(n)\underline{P}(n) = \underline{b}, \underline{b} \equiv \begin{bmatrix} 1 \\ \underline{0} \end{bmatrix} \quad \text{(Equation 10)}$$

where R(n) is symmetric and positive definite according to its definition Equation (9), and $\underline{b}$ is an N vector with all its elements zero except the very first, which is unity.

Although Eq. (10) is much simpler to be solved than the original matrix inversion problem, it is still quite expensive, and especially division extensive, to do that with classical methods like Gaussian elimination. Therefore the obtained system of linear equations is solved by one of iterative descending methods which provide an inherent stability of operation and avoid accumulation of numerical errors as will be described in detail below.

5. Stable Fast Affine Projection Filter with General Step Size

As mentioned above, the concept described in section 4 above, is only suitable for applications where a relatively large $\alpha$ (the one equal to unity or less than but very close to unity) is needed. Although a large $\alpha$ is needed in most applications, the method of adaptive filtering wouldn't be regarded as complete without addressing cases with smaller normalized step sizes. For example, one way of reducing the misadjustment (steady state output error) after the FAP system has converged is to use a small $\alpha$. According to Equation (6), determining of an updating part of the filter coefficients may be performed either by a direct solving for $\underline{\epsilon}(n)$ (second line of Eq. (6), 1st formula), or by determining an inverse auto-correlation matrix (second line of Eq.(6), second formula) with further calculation of $\underline{e}(n)$. Each of the above approaches requires to solve N systems of linear equations based on the auto-correlation matrix. According to the present invention, the beneficial way to do that is to use descending iterative methods providing stability of operation as will be described below.

C. Preferred Embodiments of the Invention

A method of adaptive filtering implemented in an adaptive filter 100 according to the first embodiment of the invention includes an iterative "steepest descent" technique to iteratively solve the Equation (10).

In general, steepest descent is a technique that seeks the minimum point of a certain quadratic function iteratively. At each iteration (the same as sampling interval in our application), it takes three steps consecutively:

1. to find the direction in which the parameter vector should go. This is just the negative gradient of the quadratic function at the current point;
2. to find the optimum step size for the parameter vector updating so that it will land at the minimum point along the direction dictated by the above step; and
3. to update the parameter vector as determined above.

By iteratively doing the above, the steepest descent reaches the unique minimum of the quadratic function, where the gradient is zero, and continuously tracks the minimum if it moves. Details about the steepest descent method can be found, for example, in a book by David G. Luenberger (Stanford University), Linear and Nonlinear Programming, Addison-Wesley Publishing Company, 1984.

For an adaptive filtering application, the implied quadratic function is as follows $$\frac{1}{2}\underline{P}^T(n)R(n)\underline{P}(n) - \underline{P}^T\underline{b} \quad \text{(Equation 11)}$$

whose gradient with respect to $\underline{P}(n)$ can be easily found as $$\underline{g} = R(n)\underline{P}(n) - \underline{b} \quad \text{(Equation 12)}$$

where $\underline{b}$ is defined in Equation (10). Note that $R(n)$ must be symmetric and positive definite in order for the steepest descent technique to be applicable, this happens to be our case. Seeking the minimum, where the gradient vanishes, is equivalent to solving Equation (10). The steepest descent is also able to track the minimum point if it moves, such as the case with a non-stationary input signal $\underline{X}(n)$.

Based on the above discussion, the stable FAP (SFAP) method which uses the steepest descent technique includes the following steps:

Initialization:

$$\underline{W}(0) = \underline{0}, \, \underline{X}(0) = \underline{0}, \, \underline{\eta}(0) = \underline{0}, \, R(0) = \delta I, \, \alpha = 1, \quad \text{(Equation 13)}$$

$$\underline{P}(0) = \begin{bmatrix} \frac{1}{\delta} \\ \underline{0} \end{bmatrix}$$

Updating the adaptive filter coefficients in sampling interval n including:

recursive determining of an auto-correlation matrix:

$$R(n) = R(n-1) + \underline{\xi}(n)\underline{\xi}^T(n) - \underline{\xi}(n-L)\underline{\xi}^T(n-L) \quad \text{(Equation 14)}$$

where $\underline{\xi}(n)$ is defined in equation (23) below, and determining projection coefficients by solving the system of linear Equations (10) using the steepest descent technique, the projection coefficients being the coefficients of the inverse of the auto-correlation matrix:

$$\underline{g}(n) = R(n)\underline{P}(n-1) - \begin{bmatrix} 1 \\ \underline{0} \end{bmatrix} \quad \text{(Equation 15)}$$

$$\beta(n) = \frac{\underline{g}^T(n)\underline{g}(n)}{\underline{g}^T(n)R(n)\underline{g}(n)} \quad \text{(Equation 16)}$$

$$\underline{P}(n) = \underline{P}(n-1) - \beta(n)\underline{g}(n) \quad \text{(Equation 17)}$$

and performing an adaptive filtering for updating the filter coefficients $$\underline{W}(n) = \underline{W}(n-1) + \alpha \eta_{N-1}(n-1)\underline{X}(n-N) \quad \text{(Equation 18)}$$

$$y(n) = \underline{W}^T(n)\underline{X}(n) + \alpha \underline{\tilde{\eta}}^T(n-1)\underline{\tilde{R}}(n) \quad \text{(Equation 19)}$$

$$e(n) = d(n) - y(n) \quad \text{(Equation 20)}$$

$$\underline{\varepsilon}(n) = e(n)\underline{P}(n) \quad \text{(Equation 21)}$$

$$\underline{\eta}(n) = \begin{bmatrix} 0 \\ \underline{\bar{\eta}}(n-1) \end{bmatrix} + \underline{\varepsilon}(n) \quad \text{(Equation 22)}$$

where $\underline{\xi}(n)$ is $$\underline{\xi}(n) \equiv \begin{bmatrix} x(n) \\ x(n-1) \\ \dots \\ x(n-N+1) \end{bmatrix} \quad \text{(Equation 23)}$$

$\underline{R}(n)$ is the first column of $R(n)$, $\underline{\tilde{R}}(n)$ is an N−1 vector that consists of the N−1 lower most elements of the N vector $\underline{R}(n)$, and $\underline{\bar{\eta}}(n)$ is an N−1 vector that consists of the N−1 upper most elements of the N vector $\underline{\eta}(n)$.

It is important to note that feedback adjustment provided by Equations (15), (16) and (17) does not exist in known prior art approaches. The prior art FAP approaches determine P(n) based on P(n−1) and the new incoming data X(n) only, without examining how well a P actually approximates $R^{-1}(n)$. Therefore inevitable numerical errors will accumulate and eventually make the system collapse. The feedback provided by a stable descending method, used in our invention, uses Equation (15) to examine how well P(n−1), or the needed part of it, approximates $R^{-1}(n)$, or its corresponding part. Then the adjustments are performed in Equations (16) and (17) accordingly to derive P(n), or the needed part of it. As just mentioned, this examination is done by evaluating g(n) in Equation (15) as the feedback error.

The three expressions shown in Equations (15), (16) and (17) correspond to the three steps of the steepest descent technique discussed above. g(n) is the gradient of the implied quadratic function (Equation (15)), β(n) is the optimum step size for parameter vector adjustment, which is made in Equation (17). As follows from Table 1, the total computational requirement of the Stable FAP method according to the first embodiment of the invention is $2L+2N^2+7N-1$ MACs and 1 division. Note, that for the steepest descent technique to work adequately for the purpose of adaptive filtering, the projection order N has to be chosen to assure that the steepest descent converges faster than the adaptive filter coefficients do. The required predetermined value of N will depend on a particular adaptive filtering application.

An adaptive filter 100 according to the first embodiment of the invention and operating in accordance with the method described above is shown in FIG. 2. It includes a filter 102 characterized by adaptive filter coefficients $\underline{W}(n)$, and means 104 for updating the coefficients, the means being set with a normalized step size $\alpha$ close to its maximal value, i.e. unity. The filter 102 is a finite impulse response (FIR) filter which receives a

TABLE 1

| Equation | Multiply and accumulate operations | Division |
|---|---|---|
| 14 | 2N | |
| 15 | N | |
| 16 | $N^2$ | 1 |
| 17 | N | |
| 18 | L | |
| 19 | L + N − 1 | |
| 20 | | |
| 21 | N | |
| 22 | | |
| Total | $2L + 2N^2 + 7N - 1$ | 1 | reference input signal x(n) and an auxiliary signal f(n) (see Equation (33) below), used for updating the coefficients, and generates a provisional echo estimate signal PR(n) (see Equation (34) below). The updating means 104 includes a correlator 106 for recursively determining an auto-correlation signal presented in the form of auto-correlation matrix coefficients R(n) based on the reference input signal x(n), and a calculator 108 for generating projection coefficients $\underline{P}(n)$, the projection coefficients being part of the coefficients of the inverse of the auto-correlation matrix. The calculator 108 defines projection coefficients by using an iterative steepest descent method having an inherent stability of operation as illustrated in detail above. The projection coefficients are used within updating means 104 for generation the auxiliary filter adaptation signal f(n) and an echo estimate correction signal EC(n) (see Equation (34) below). The latter is used together with the provisional echo estimate PR(n) to produce the echo estimate signal y(n).

Figure 2:
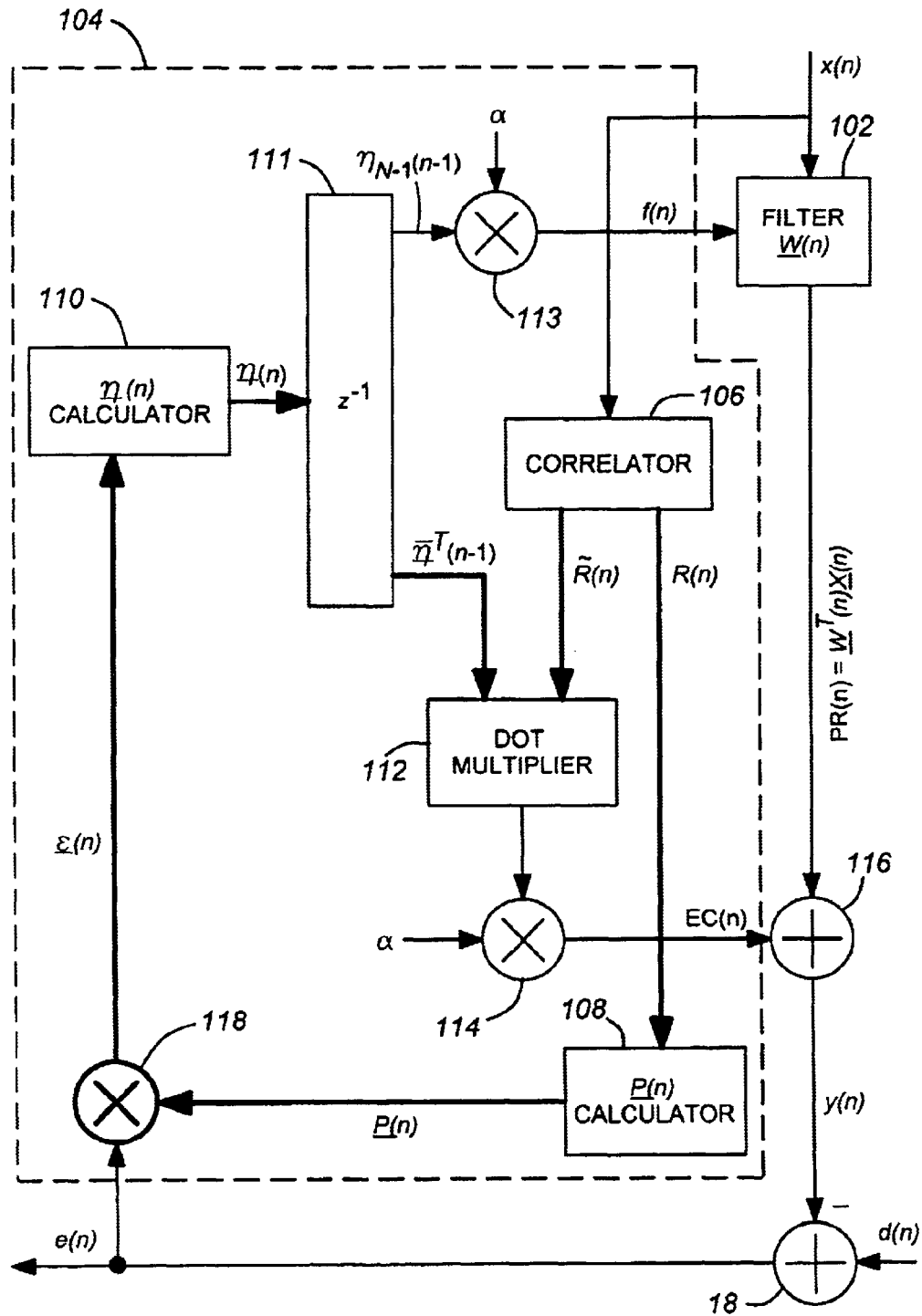
FIG. 2 is a block diagram of an adaptive filter according to the first embodiment of the invention.

A convention in FIG. 2 is the use of a thick line to represent the propagation of a matrix or vector signal, i.e., with more than one component, and the use of a thin line to stand for a scalar signal propagation. In FIG. 2 a correlator 106 determines the autocorrelation matrix R(n) in accordance with the Eq. 14 using the current and past x(n) samples. An "$\underline{\eta}(n)$ calculator" 110 calculates $\underline{\eta}(n)$ based on Eq. 22, and as shown in FIG. 2, $\underline{\eta}(n)$ is not used by the updating means 104 until the next sampling interval. The filter 102 produces the convolutional sum $\underline{W}^T(n)\underline{X}(n)$. $\eta_{-1}(n-1)$ is obtained from $\eta_{N-1}(n)$ by putting the latter through a unit delay element 111, providing a delay of one sampling interval, and further multiplied by the step size $\alpha$ in a Multiplier 113. The result is used for updating the adaptive filter coefficients in (Eq. 18). $\overline{\underline{\eta}}^T(n-1)$ is dot-multiplied with part of R(n) by a Dot multiplier 112, and the result is further multiplied by a multiplier 114 with the step size $\alpha$ to form the correction term to be added to $\underline{W}^T(n)\underline{X}(n)$ by the summer 116 to form the filter output y(n) (Equation (19)). The summer 18 calculates the error, or the output, e(n), as in Equation (20). The scalar-vector multiplier 118 derives $\underline{\epsilon}(n)$ in accordance with Equation (21).

Figure 3:
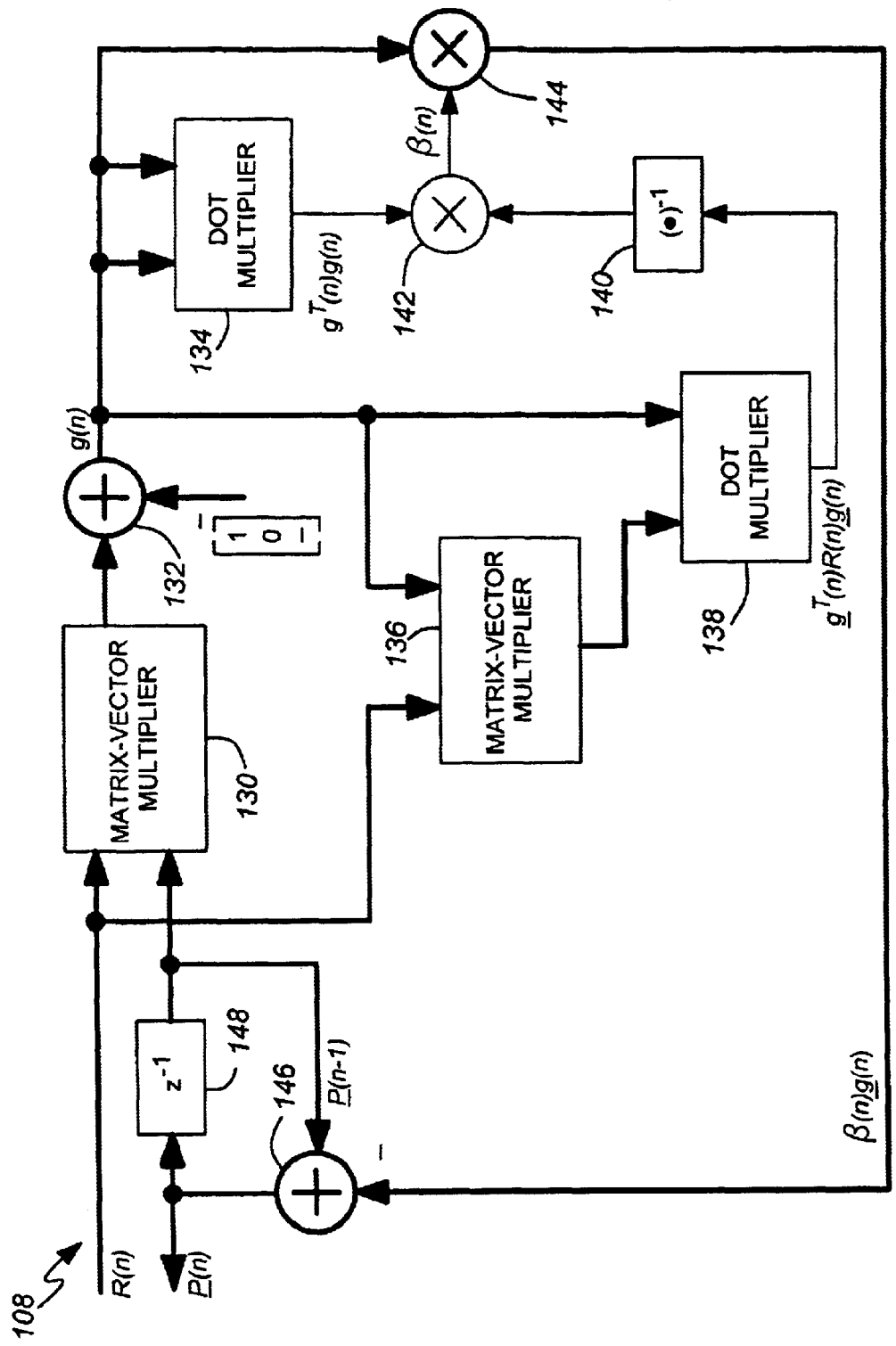
FIG. 3 is a block diagram of a steepest descent calculator embedded in the filter of FIG. 2.

A steepest descent calculator 108 is shown in detail in FIG. 3. Thick lines represent the propagation of a matrix or vector signal, i.e., with more than one component, and the use of a thin line stands for a scalar signal propagation. In the calculator 108, the auto-correlation matrix R(n) and the vector $\underline{P}(n-1)$ which is a part of the estimated inverse of R(n−1), are multiplied in a Matrix-vector multiplier 130. The vector product is further subtracted by a constant vector $[1\ 0 \ldots 0\ ]^T$ in a Summer 132 to produce the gradient vector $\underline{g}(n)$, which contains the feedback error information about using $\underline{P}(n-1)$ as the estimated inverse of R(n). This part corresponds to Equation (15). The squared norm of $\underline{g}(n)$ is then found by dot-multiplying $\underline{g}(n)$ with itself in a Dot multiplier 134. It is used as the numerator in calculating $\beta(n)$ in Equation 16. A Matrix-vector multiplier 136 finds the vector product between the autocorrelation matrix R(n) and the gradient vector $\underline{g}(n)$. This vector product is then dot-multiplied with $\underline{g}(n)$ in another Dot multiplier 138 to produce the denominator in calculating $\beta(n)$ in Equation (16). This denominator is reciprocated in a Reciprocator 140, and then further scalar-multiplied with the aforementioned numerator in scalar multiplier 142 to produce $\beta(n)$. This is the only place where any division operation is performed. Finally, $\beta(n)$ is multiplied with the gradient $\underline{g}(n)$ in a scalar-vector multiplier 144 to form the correction term to $\underline{P}(n-1)$. This correction term is then subtracted from $\underline{P}(n-1)$ in a Vector Summer 146 to derive $\underline{P}(n)$ in accordance with Equation (17). $\underline{P}(n-1)$ is obtained from $\underline{P}(n)$ by using a unit delay element 148, providing a delay of one sampling interval.

Two C language prototypes implementing the steepest descent technique according to the first embodiment of the invention have been built. The first one is a floating point module, and the second one is a 16-bit fixed-point DSP implementation. A floating-point module simulating the NLMS acoustic echo canceller design in Venture, a successful full-duplex handsfree telephone terminal product by Nortel Networks Corporation, and a bench mark, floating-point module that repeats a prior art FAP scheme by Q. G. Liu, B. Champagne, and K. C. Ho (Bell-Northern Research and INRS-Télécommunications, Université du Québec), "On the Use of a Modified Fast Affine Projection Algorithm in Subbands for Acoustic Echo Cancellation," pp. 354–357, Proceedings of 1996 IEEE Digital Signal Processing Workshop, Loen, Norway, September 1996, have been also implemented for comparison purposes. The following data files have been prepared for processing. The source ones are speech files with Harvard sentences (Intermediate Reference System filtered or not) sampled at 8 KHz and a white noise file. Out of the source files certain echo files have been produced by filtering the source ones with certain measured, 1200-tap, room impulse responses. These two sets of files act as x(n) and d(n) respectively. The major simulation results are as follows. The bench mark prior art floating-point FAP scheme with L=1024 and N=5, goes unstable at 2'57" (2 minutes and 57 seconds, real time, with 8 KHz sampling rate) with speech training, but with certain unhealthy signs showing up after only about 25 seconds. These signs are in the form of improper excursions of the elements of the vector $\underline{P}(n)$, first column of P(n) (inverse of the matrix R(n)). The fact that it takes over 2 minutes from the first appearance of unhealthy signs to divergence, in which period the excursions of the $\underline{P}(n)$ elements become worse and worse, shows that the coefficient updating algorithm is quite tolerant of certain errors in P(n). Once simulated random quantization noises, which are uniformly distributed between −0.5 bit and +0.5 bit of a 16-bit implementation, are injected into the matrix inversion lemma calculation, the prior art FAP system diverges in 0.6 second.

For comparison, within the time period of our longest test case (7'40"), the portions that estimate $\underline{P}(n)$, i.e., Eqs.

(15)–(17) of the steepest descent scheme of the invention with the same parameters (L=1024 and N=5), always remain stable. Furthermore, the elements in the vector $\underline{P}(n)$ progress as expected, without any visible unhealthy signs like improper excursions during the entire 7'40" period. The output e(n) in the steepest descent embodiment converges approximately at the same speed as the bench mark prior art FAP and reaches the same steady state echo cancellation depth as the prior art FAP and NLMS. The SFAP according to the first embodiment of the invention outperforms NLMS filter; with speech training, it converges in about 1 second while it takes the NLMS filter about 7 to 8 seconds to do so.

Filters of another length L=512 have also been built for SFAP, the prior art FAP and NLMS. As expected, they converge approximately twice as fast as they do for L=1024.

Thus, the adaptive filter and method using a steepest descent calculator for determining the inverse matrix coefficients, providing a stability of adaptive filtering, are provided.

Figure 4:
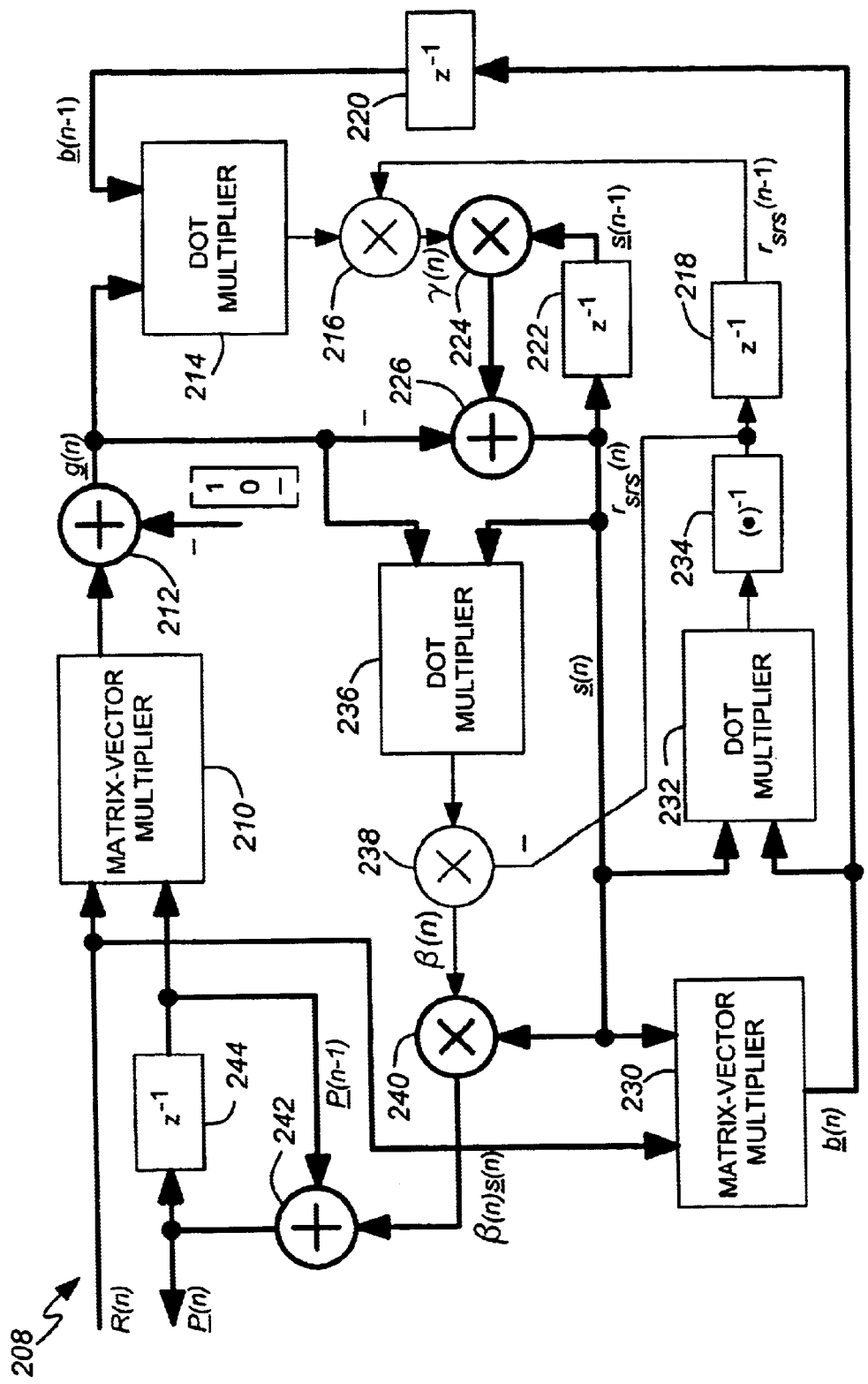
FIG. 4 is a block diagram of a conjugate gradient calculator embedded in an adaptive filter according to a second embodiment of the invention.

A method of adaptive filtering according to a second embodiment of the present invention uses an iterative "conjugate gradient" technique to iteratively solve the Equation (10), the corresponding calculator being shown in FIG. 4.

Conjugate gradient is a technique that also seeks the minimum point of a certain quadratic function iteratively. Conjugate gradient is closely related to the steepest descent scheme discussed above. It differs from the steepest decent in that it is guaranteed to reach the minimum in no more than N steps, with N being the order of the system. That is, conjugate gradient usually converges faster than the steepest descent. At each iteration (the same as sampling interval in out application), the conjugate gradient takes five steps consecutively:

1. to find the gradient of the quadratic function at the current point;
2. to find the optimum factor for adjusting the direction vector, along which adjustment to the parameter vector will be made;
3. to update the direction vector as determined above;
4. to find the optimum step size for the parameter vector updating; and
5. to update the parameter vector as determined above.

Unlike the steepest descent algorithm, which simply takes the negative gradient of the quadratic function as the parameter vector updating direction, conjugate gradient modifies the negative gradient to determine an optimized direction. By iteratively doing the above, the scheme reaches the unique minimum of the quadratic function, where the gradient is zero, in no more than N steps. The conjugate gradient technique also continuously tracks the minimum if it moves, such as the case with non-stationary input signal x(n). Details about the conjugate gradient algorithm can be found, for example, in a book by David G. Luenberger (Stanford University), Linear and Non-linear Programming, Addison-Wesley Publishing Company, 1984.

For an adaptive filtering application, the implied quadratic function is still shown in Equation (11), whose gradient with respect to $\underline{P}(n)$ is also Equation (12). Note that R(n) must be symmetric and positive definite in order for the conjugate gradient technique to apply, this happens to be our case. Seeking the minimum, where the gradient vanishes, is equivalent to solving Equation (10). The conjugate gradient is also able to track the minimum point if it moves, such as the case with non-stationary input signal $\underline{X}(n)$.

Based on the above discussion, the SFAP method according to the second embodiment, which uses the conjugate gradient technique, includes the following steps:

Initialization:

$$\underline{W}(0) = \underline{0},\ \underline{X}(0) = \underline{0},\ \underline{\eta}(0) = \underline{0}, \quad \text{(Equation 24)}$$

$$R(0) = \delta I,\ \alpha = 1,\ \underline{P}(0) = \begin{bmatrix} 1/\delta \\ \underline{0} \end{bmatrix}$$

$$\underline{s}(0) = \underline{0},\ r_{srs}(0) = 0,\ \underline{b}(0) = \underline{0}$$

Updating the adaptive filter coefficients in sampling interval n including:

recursive determining of an auto-correlation matrix:

$$R(n)=R(n-1)+\underline{\xi}(n)\underline{\xi}^T(n)-\underline{\xi}(n-L)\,\underline{\xi}^T(n-L) \quad \text{(Equation 25)}$$

where $\underline{\xi}(n)$ is defined in Equation (23) above, and determining projection coefficients by solving the system of linear Equations (10) using the conjugate technique, the projection coefficients being first column coefficients of the inverse of the auto-correlation matrix:

$$\underline{g}(n) = R(n)\underline{P}(n-1) - \begin{bmatrix} 1 \\ \underline{0} \end{bmatrix} \quad \text{(Equation 26)}$$

$$\gamma(n)=r_{srs}(n-1)\underline{g}^T(n)\underline{b}(n-1) \quad \text{(Equation 27)}$$

$$\underline{s}(n)=\gamma(n)\underline{s}(n-1)-\underline{g}(n) \quad \text{(Equation 28)}$$

$$\underline{b}(n)=R(n)\underline{s}(n) \quad \text{(Equation 29)}$$

$$r_{srs}(n) = \frac{1}{\underline{s}^T(n)\underline{b}(n)} \quad \text{(Equation 30)}$$

$$\beta(n)=-r_{srs}(n)\underline{g}^T(n)\underline{s}(n) \quad \text{(Equation 31)}$$

$$\underline{P}(n)=\underline{P}(n-1)+\beta(n)\underline{s}(n) \quad \text{(Equation 32)}$$

and performing an adaptive filtering for updating the filter coefficients $$\underline{W}(n)=\underline{W}(n-1)+\alpha\eta_{N-1}(n-1)\underline{X}(n-N)=\underline{W}(n-1)+f(n)\underline{X}(n-N) \quad \text{(Equation 33)}$$

$$y(n)=\underline{W}(n)\underline{X}(n)+\alpha\underline{\bar{\eta}}^T(n-1)\,\underline{\tilde{R}}(n)=PR(n)+EC(n) \quad \text{(Equation 34)}$$

$$e(n)=d(n)-y(n) \quad \text{(Equation 35)}$$

$$\underline{\varepsilon}(n)=e(n)\underline{P}(n) \quad \text{(Equation 36)}$$

$$\underline{\eta}(n) = \begin{bmatrix} 0 \\ \underline{\bar{\eta}}(n-1) \end{bmatrix} + \underline{\varepsilon}(n) \quad \text{(Equation 37)}$$

where $\underline{R}(n)$ is the first column of R(n), $\underline{\tilde{R}}(n)$ is an N−1 vector that consists of the N−1 lower most elements of the N vector $\underline{R}(n)$, and $\underline{\bar{\eta}}(n)$ is an N−1 vector that consists of the N−1 upper most elements of the N vector $\underline{\eta}(n)$.

The five expressions shown in Equations (26), (27), (28), (31) and (32) respectively correspond to the five steps of the conjugate gradient technique discussed earlier in this section. $\underline{g}(n)$ is the gradient of the implied quadratic function, $\gamma(n)$ is the optimum factor for updating the direction vector $\underline{s}(n)$. $\beta(n)$ is the optimum step size for parameter vector adjustment, which is made in Equation (32).

As shown in Table 2, the total computational requirement of the Stable FAP method according to the second embodiment of the invention is $2L+2N^2+9N+1$ MACs and 1 division. It should be also ensured that the conjugate gradient converges fast enough so that the adaptive filter coeffients converge.

An adaptive filter according to the second embodiment of the invention is similar to that of the first embodiment shown in FIG. 2 except for the calculator 108 now operating in accordance with the conjugate gradient technique and being designated by numeral 208 in FIG. 4.

The conjugate gradient calculator 208 embedded in the adaptive filter of the second embodiment is shown in detail in FIG. 4. Thick lines represent the propagation of a matrix or vector signal, i.e., with more than one component, and the use of a thin line stands for a scalar signal propagation. In the calculator 208, the autocorrelation matrix R(n) and the vector $\underline{P}$(n−1), part of the estimated inverse of R(n−1), are multiplied in a Matrix-vector Multiplier 210. The resulted vector product is subtracted by a constant vector $[1\ 0\ \ldots\ 0]^T$ in a Summer 212 to produce the gradient vector $\underline{g}$(n), which contains the feedback error information about using $\underline{P}$(n−1) as the estimated inverse of R(n). The Matrix-vector Multiplier 210 and the Summer 212 implement the Equation (26) above. The gradient $\underline{g}$(n) is further dot-multiplied with $\underline{b}$(n−1), an auxiliary vector found in the last sampling interval, in a Dot Multiplier 214. The resulted scalar product is multiplied by $r_{srs}$(n−1) in a Multiplier 216, to produce γ(n), a factor to be used in adjusting $\underline{s}$(n−1), the direction vector for adjusting $\underline{P}$(n−1). $r_{srs}$(n−1) is obtained from $r_{srs}$(n) by putting the latter through a unit delay element 218, providing a delay of one sampling interval. Similarly, $\underline{b}$(n−1) is obtained from $\underline{b}$(n) by using another unit delay element 220. The part of the diagram described in this paragraph implements Equation (27) shown above. With γ(n), $\underline{g}$(n), and $\underline{s}$(n−1) available, $\underline{s}$(n−1) is then updated into $\underline{s}$(n) by using yet another unit delay element 222, with a delay of one sampling interval, scalar-vector Multiplier 224 and Vector Summer 226 which implement operations shown in Equation (28) above. Next, the auxiliary vector $\underline{b}$(n), to be used in the next sampling interval, is calculated as the product between R(n) and $\underline{s}$(n) in another Matrix-vector Multiplier 230. This implements Equation (29) above. The vector $\underline{b}$(n) is then dot-multiplied with $\underline{s}$(n) in yet another Dot multiplier 232, and the scalar product is reciprocated in a Reciprocator 234, to produce $r_{srs}$(n) (Equation (30)). This is where the only division operation is. By using yet another Dot Multiplier 236 and a Multiplier 238, $\underline{g}$(n) and $\underline{s}$(n) are dot-multiplied, and the result, being a scalar product, is multiplied with $-r_{srs}$(n) to derive β(n), thus implementing Equation (31) above. Once β(n) is available, it is multiplied with $\underline{s}$(n) in another scalar-vector Multiplier 240 to form the correction term to $\underline{P}$(n−1), which is then added to $\underline{P}$(n−1) in a Vector Summer 242 in order to derive $\underline{P}$(n) (Equation (32) above).

The rest of the structure of the adaptive filter, employing the conjugate gradient calculator 208, is similar to that shown in FIG. 2 and described above.

TABLE 2

| Equation | Multiply and accumulate operations | Division |
| --- | --- | --- |
| 25 | 2N | |
| 26 | $N^2$ | |
| 27 | N + 1 | |
| 28 | N | |
| 29 | $N^2$ | |
| 30 | N | 1 |
| 31 | N + 1 | |
| 32 | N | |
| 33 | L | |
| 34 | L + N − 1 | |

TABLE 2-continued

| Equation | Multiply and accumulate operations | Division |
| --- | --- | --- |
| 35 | | |
| 36 | N | |
| 37 | | |
| Total | $2L + 2N^2 + 9N + 1$ | 1 |

A C language prototype for 16-bit fixed-point DSP implementation of the SFAP using the conjugate gradient scheme has been built and studied. It has the same parameters ters (L=1024 and N=5) and uses same data files as the steepest descent prototype described above. It behaves very similarly to its floating-point steepest descent counterpart. There is no observable difference in the way $\underline{P}$(n) elements progress, and they also remain stable during the 7'40" longest test case period. The output e(n) in the conjugate gradient embodiment converges approximately at the same speed as the bench mark prior art FAP and reaches the same steady state echo cancellation depth as the bench mark prior art FAP and NLMS. The SFAP according to the second embodiment of the invention also ourperformes NLMS filter in terms of convergence speed. A conjugate gradient filter of another length L=512 have been also built. As expected, it converges twice as fast as it does for L=1024.

A method of adaptive filtering according to a third embodiment of the present invention provides adaptive filtering when the normalized step size has any value from 0 to 1. It updates the adaptive filter coefficients by iteratively solving a number of systems linear equations having decrementing orders to determine the inverse auto-correlation matrix in a manner described below.

Let's prove first that, if P is the inverse of a symmetric matrix R, then it is also symmetric. By definition $$RP=I,\ PR=I \qquad \text{(Equation 38)}$$

Transposing Equation (38) we get $$P^T R^T = I^T,\ R^T P^T = I^T \qquad \text{(Equation 39)}$$

respectively. Since R and I are symmetric, Equation (39) can be written as $$P^T R = I,\ RP^T = I \qquad \text{(Equation 40)}$$

This means that $P^T$ is also the inverse of R. Since the inverse of a matrix is unique, the only possibility is $$P^T = P \qquad \text{(Equation 41)}$$

That is, P is symmetric.

Based on the understanding that the inverse of a symmetric matrix is also symmetric, let's consider a sampling interval n where we need to find an N-th order square matrix P(n) so that $$R(n)P(n)=I \qquad \text{(Equation 42)}$$

Equation (42) can be written in a scalar form $$\sum_{k=0}^{N-1} r_{ik}(n) p_{kj}(n) = \delta_{ij},\ \forall\ i, j \in [0, N-1] \qquad \text{(Equation 43)}$$

where $r_{ik}(n)$ is the element of $R(n)$ on row i and column k, and $p_{kj}(n)$ the element of $P(n)$ on row k and column j, and $d_{ij}$ is defined as $$\delta_{ij} = \begin{cases} 1, & \text{if } i = j \\ 0, & \text{otherwise} \end{cases} \quad \text{(Equation 44)}$$

We first solve the set of N linear equations defined by j=0 in Equation (43), for $\{p_{k0}(n), k=0,1, \ldots, N-1\}$, i.e.

$$\sum_{k=0}^{N-1} r_{ik}(n) p_{k0}(n) = \delta_{i0}, \forall i \in [0, N-1] \quad \text{(Equation 45)}$$

Equation (45) coincides with Equation (10) derived earlier and applied to the first and second embodiments of the invention.

$$R(n)\underline{P}(n) = \begin{bmatrix} 1 \\ \underline{0} \end{bmatrix} \quad \text{(Equation 46)}$$

The right hand side of Equation (45) or Equation (46) tells that $\underline{P}(n)$ is the left-most column of $P(n)$ and, based on Equation (41), $\underline{P}^T(n)$ is also the upper-most row of $P(n)$. According to the first and second embodiments of the invention discussed above, this part will cost "$2N^2+3N$" MACs and 1 division with steepest descent or "$2N^2+5N+2$" MACs and 1 division with conjugate gradient.

Having dealt with the j=0 case, we now start solving the set of N linear equations defined by j=1 in Equation (43), for $\{p_{k1}(n), k=0, 1, \ldots, N-1\}$, i.e.

$$\sum_{k=0}^{N-1} r_{ik}(n) p_{k1}(n) = \delta_{i1}, \forall i \in [0, N-1] \quad \text{(Equation 47)}$$

Because $P(n)$ is symmetric so that $p_{01}(n)$ equals $p_{10}(n)$, Equation (47) can be re-arranged to become $$\sum_{k=1}^{N-1} r_{ik}(n) p_{k1}(n) = \delta_{i1} - r_{i0}(n) p_{10}(n), \forall i \in [0, N-1] \quad \text{(Equation 48)}$$

with still N equations but only N–1 instead of N unknowns, i.e., $\{p_{k1}(n), k=1, 2, \ldots, N-1\}$, to solve. In general, these N–1 unknowns can be uniquely determined by only N–1 equations. Thus, the equation in Equation (48) with i=0 can be omitted so that it becomes $$\sum_{k=1}^{N-1} r_{ik}(n) p_{k1}(n) = \delta_{i1} - r_{i0}(n) p_{10}(n), \forall i \in [1, N-1] \quad \text{(Equation 49)}$$

Equation (49) has the same format as Equation (45) except that the order is reduced by one. Equation (49) can also be solved by using either of the two approaches presented above, costing "$2(N-1)^2+4(N-1)$ MACs and 1 division with steepest descent" or "$2(N-1)^2+6(N-1)+2$ MACs and 1 division with conjugate gradient," where the added "(N–1)" in each of the two expressions accounts for the extra computations needed to calculate the right hand side of Equation (49).

By repeating the above recursion steps, with the order of the problem decrementing by one each step, we can completely solve the lower triangle of $P(n)$. Since $P(n)$ is symmetric, this is equivalent to solving the entire $P(n)$. A formula for this entire process can be derived from Equation (43) and the concept described above, as follows:

For $j = 0, 1, \ldots, N-1$, solve (Equation 50)

$$\boxed{\sum_{k=j}^{N-1} r_{ik}(n) p_{kj}(n) = \begin{cases} \delta_{ij}, & j = 0 \\ \delta_{ij} - \sum_{k=0}^{j-1} r_{ik}(n) p_{jk}(n), & 1 \leq j \leq N-1 \end{cases} \\ \forall i \in [j, N-1]}$$

for $\{p_{kj}(n), \forall k \in [j, N-1]\}$

Note that the right hand sides of Equation (50) for all i at each recursion step j do not contain any unknowns, i.e., $\{P_{jk}(n)\}$ there have already been found in previous stages, Equation (45) and Equation (49) are just special cases of Equation (50), and $\{P_{kj}(n), k=j, j+1, \ldots, N-1\}$ found in recursion step j form a column vector $\underline{\tilde{P}}_j(n)$, which consists of the lower N(j) elements of the j'th ($0 \leq j \leq N-1$) column of $P(n)$. The process of Equation (50) will take N divisions and $$[2N^2 + 3N] + [2(N-1)^2 + 4(N-1)] + [2(N-2)^2 + \quad \text{(Equation 51)}$$
$$5(N-2)] + \ldots + [2(1)^2 + (N+2)(1)] =$$
$$\sum_{k=1}^{N} [2k^2 + (N+3-k)k] = \sum_{k=1}^{N} k^2 + (N+3) \sum_{k=1}^{N} k =$$
$$\frac{N}{6}(N+1)(2N+1) + \frac{N}{2}(N+1)(N+3) =$$
$$\frac{5}{6} N(N+1)(N+2) \text{ MACs}$$

for steepest descent method, and N divisions and $$[2N^2 + 5N + 2] + [2(N-1)^2 + 6(N-1)] + \quad \text{(Equation 52)}$$
$$2] + [2(N-2)^2 + 7(N-2)] + 2] +$$
$$\ldots + [2(1)^2 + (N+4)(1) + 2] =$$
$$\sum_{k=1}^{N} [2k^2 + (N+5-k)k + 2] =$$
$$\sum_{k=1}^{N} k^2 + (N+5) \sum_{k=1}^{N} k + 2N =$$
$$\frac{N}{6}(N+1)(2N+1) + \frac{N}{2}(N+1)(N+5) + 2N =$$
$$\frac{5}{6} N \left( N^2 + \frac{21}{5} N + \frac{28}{5} \right) \text{ MACs}$$

for conjugate gradient method. Note that in deriving Equations (51) and (52) the following formulae are used $$\sum_{k=1}^{N} k^2 = \frac{N}{6}(N+1)(2N+1) \quad \text{(Equation 53)}$$

$$\sum_{k=1}^{N} k = \frac{N}{2}(N+1)$$

which can be easily proven by mathematical induction.

Based on the above derivations, the SFAP method according to the third embodiment of the invention includes the following steps:

Initialization:

$$\underline{W}(0) = \underline{0}, \underline{X}(0) = \underline{0}, \underline{\eta}(0) =$$

$$\underline{0}, R(0) = \delta I, \underline{e}(0) = \underline{0}, \underline{P}(0) = \begin{bmatrix} 1/\delta \\ \underline{0} \end{bmatrix}$$

(Equation 54)

Updating the adaptive filter coefficients in sampling interval n including the steps shown in Equation 55 below.

Please, note that designations used in Equation (55), are as follows: $\underline{\xi}(n)$ is defined in Equation (23) above, $\underline{R}(n)$ is the first column of R(n), $\underline{\tilde{R}}(n)$ is an N−1 vector that consists of the N−1 lower most elements of the N vector $\underline{R}(n)$, and $\underline{\overline{\eta}}(n)$ is an N−1 vector that consists of the N−1 upper most elements of the N vector $\underline{\eta}(n)$. Please, also note that any division operation in the 2nd expression of Equation (55) is not performed if the denominator is not greater than zero, in which case a zero is assigned to the quotient.

Figure 6:
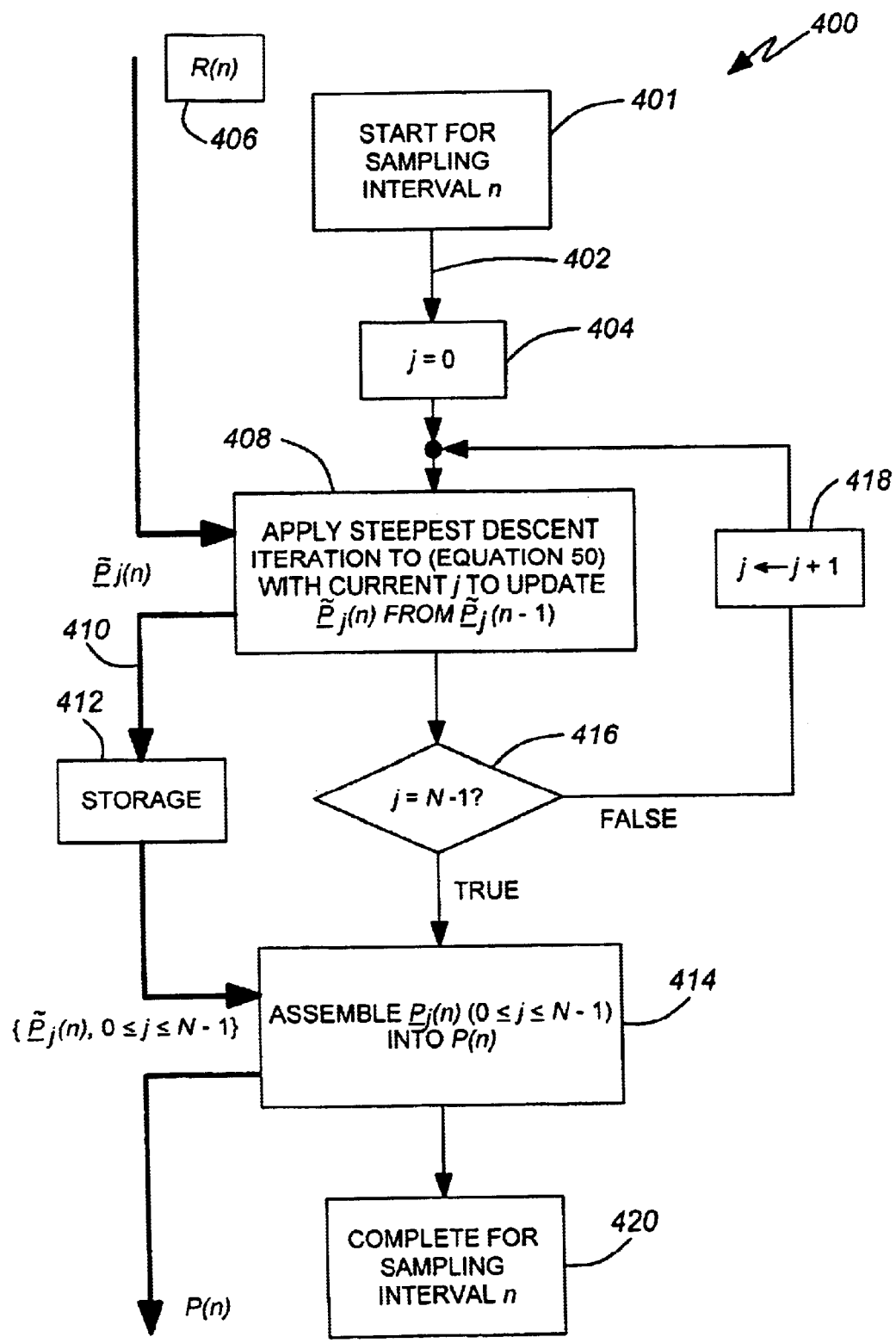
FIG. 6 is a flow-chart illustrating an operation of a steepest descent calculator embedded in the adaptive filter of FIG. 5.

The P(n) calculator 308, now being a matrix calculator, operates in accordance with the flow-chart 400 shown in FIG. 6. Upon start up for the sampling interval n (block 401), the routine 402 sets an initial value to index j (block 404) which is submitted together with the auto-correlation matrix R(n) (block 406) to a projection coefficient column calculator (block 408). The calculator provides a steepest descent iteration in accordance with Equation (50) for the current value of index j, thus updating the corresponding column of projection coefficients from the previous sampling interval (block 408). The updated column of the projected coefficients is sent to a storage means (routine 410, block 412) to be stored until the other columns of P(n) are calculated. Until the index j is equal to N−1 (block 416), its value is incremented by 1, i.e. made equal to j+1 (block 418), and the steepest descent iteration is repeated (block 408) to determine the next column of P(n). By performing N corresponding steepest descent iterations for j=0, 1, . . . N−1, all columns of the inverse auto-correlation matrix are thus (Equation 55)

| | MAC | Division |
|---|---|---|
| $R(n) = R(n-1) + \underline{\xi}(n)\underline{\xi}^T(n) - \underline{\xi}(n-L)\underline{\xi}^T(n-L)$ | 2N | |
| $P(n) = R^{-1}(n)$ — Recursion with decrementing order to do matrix inversion | $\frac{5}{6}N(N+1)(N+2)$ (Steepest descent) or $\frac{5}{6}N\left(N^2 + \frac{21}{5}N + \frac{28}{5}\right)$ (Conjugate gradient) | N |
| $\underline{W}(n) = \underline{W}(n-1) + \alpha\underline{\eta}_{N-1}(n-1)\underline{X}(n-N)$ | L | |
| $y(n) = \underline{W}^T(n)\underline{X}(n) + \alpha\underline{\overline{\eta}}^T(n-1)\underline{\tilde{R}}(n)$ | L + N − 1 | |
| $e(n) = d(n) - y(n)$ | | |
| $\underline{e}(n) = \begin{bmatrix} e(n) \\ (1-\alpha)\overline{e}(n-1) \end{bmatrix}$ | N − 1 | |
| $\underline{\varepsilon}(n) = P(n)\underline{e}(n)$ | $N^2$ | |
| $\underline{\eta}(n) = \begin{bmatrix} 0 \\ \overline{\eta}(n-1) \end{bmatrix} + \underline{\varepsilon}(n)$ | | |
| Total | $2L + \frac{5}{6}N^3 + \frac{7}{2}N^2 + \frac{17}{3}N - 2$ (Steepest descent) or $2L + \frac{5}{6}N^3 + \frac{9}{2}N^2 + \frac{26}{3}N - 2$ (Conjugate gradient) | N |

Figure 5:
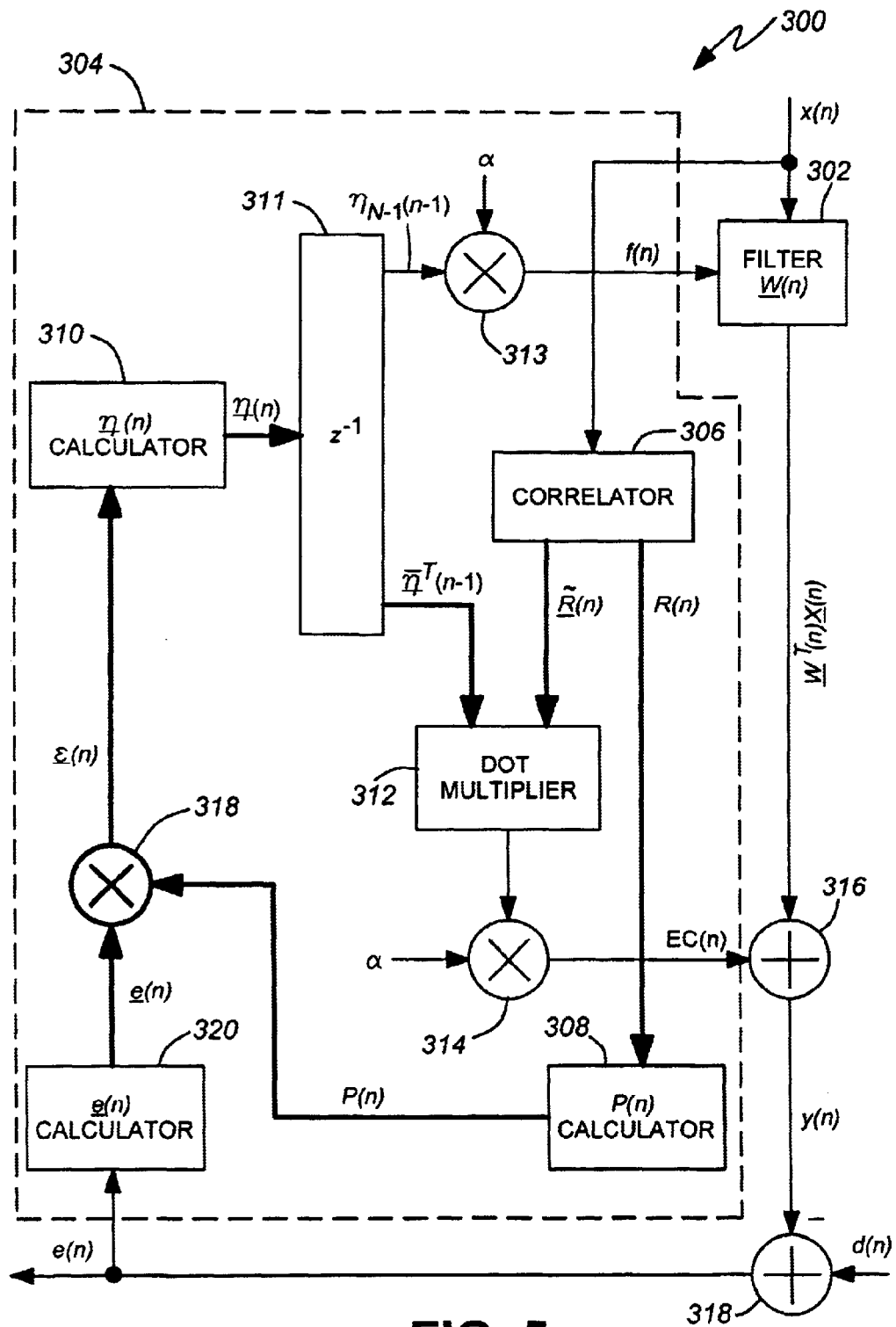
FIG. 5 is a block diagram of an adaptive filter according to a third embodiment of the invention.

An adaptive filter 300 according to a third embodiment of the invention, shown in FIG. 5, is similar to that of FIG. 2 with like elements being designated by same reference numerals incremented by 200. The filter 300 also differs from the filter 100 by the following features: the normilized step size may have any value from 0 to 1.0, the calculator 308 now has more extended structure for consecutively determining columns of the inverse auto-correlation matrix in accordance with the steepest descent technique, and an e(n) calculator 320 is added.

determined and assembled into P(n) in an assembling means (block 414). A command/signal (block 420) then notifies about the end of the sampling interval n and the beginning of the next sampling interval n+1 where the steps of the routine 400 are repeated. In FIG. 6, thick lines represent the propagation of a matrix or vector signal, i.e., with more than one component, and the use of a thin line stands for a control propagation.

Figure 7:
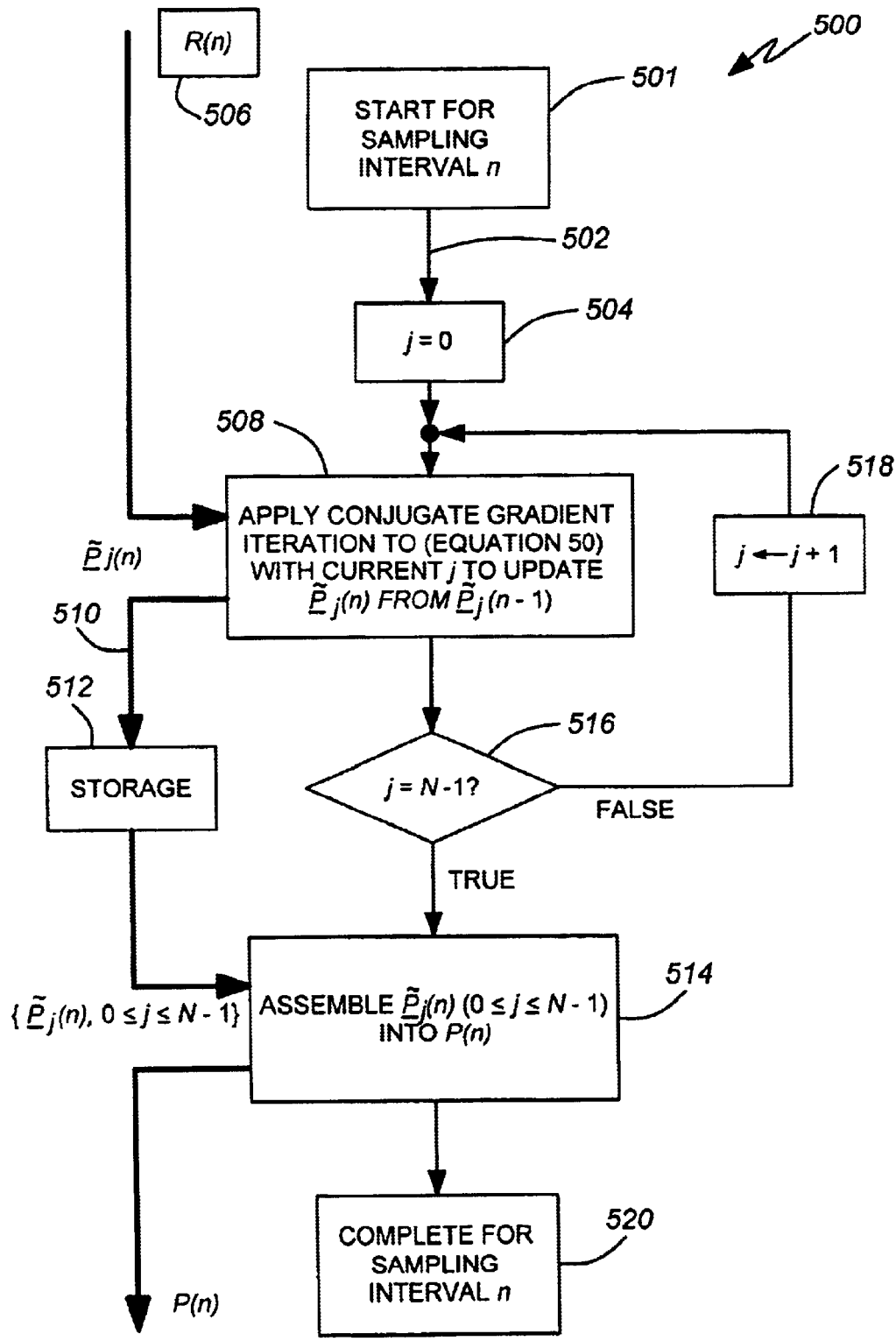
FIG. 7 is a flow-chart illustrating an operation of a conjugate gradient calculator embedded in the adaptive filter of FIG. 5.

In modification to this embodiment, the steepest descent calculator 308 may be replaced with the conjugate calculator. The corresponding structure is illustrated by a flow-chart 500 shown in FIG. 7 where the blocks similar to that ones of FIG. 6 are designated by same reference numerals incremented by 100. It operates in a manner described above with regard to FIG. 6.

A method of adaptive filtering according to a fourth embodiment of the present invention also provides adaptive filtering when the normalized step size has any value from 0 to 1. It updates the adaptive filter coefficients by iteratively solving a number of systems linear equations which avoid an explicit matrix inversion performed in the third embodiment of the invention. The details are described below.

The second equation from the set of Equations (6), which is reproduced for convenience in Equation (56) below, is equivalent to $$R(n)\epsilon(n) = e(n) \qquad \text{(Equation 56)}$$

It is possible to obtain $\epsilon(n)$, required for updating the adaptive filter coefficients, directly from the set of linear Equations (56), which are solved again by one of the descending iterative methods.

As a way of example, we will use a conjugate gradient method and perform N conjugate gradient iterations so that an exact solution, not an iterated one, is reached. It is ensured by the fact that the conjugate gradient method is guaranteed to reach the solution in no more than N iterations, with N being the order of the problem, see Equation (55). It is convenient to start with $\epsilon(n) = 0$ before iterations begin at each sampling interval n to save some computation time.

Accordingly, the SFAP method of the fourth embodiment of the invention includes the following steps:

|  | MAC | Division |
|---|---|---|
|  |  | (Equation 57) |
| Initialization: |  |  |
| $\epsilon_t(0) = \underline{0}$, $\underline{s}(0) = \underline{0}$, $r_{srs}(0) = 0$, $\underline{b}(0) = \underline{0}$ |  |  |
| In sampling internal n, repeat the following equations N times, i.e., for $k = 0, 1, \ldots, N - 1$: |  |  |
| $\underline{g} = R(n)\underline{\epsilon}_t(k) - \underline{e}(n)$ | $(N - 1) \times N^2$ |  |
| $\gamma = r_{srs}(k)\underline{g}^T\underline{b}(k)$ | $(N - 1) \times (N + 1)$ |  |
| $\underline{s}(k + 1) = \gamma\underline{s}(k) - \underline{g}$ | $(N - 1) \times N$ |  |
| $\underline{b}(k + 1) = R(n)\underline{s}(k + 1)$ | $N \times N^2$ |  |
| $r_{srs}(k + 1) = \dfrac{1}{\underline{s}(k+1)^T \underline{b}(k+1)}$ | $N \times N$ | $N \times 1$ |
| $\beta = -r_{srs}(k + 1)\underline{g}^T\underline{s}(k + 1)$ | $N \times (N + 1)$ |  |
| $\underline{\epsilon}_t(k + 1) = \underline{\epsilon}_t(k) + \beta\underline{s}(k + 1)$ | $N \times N$ |  |
| Output: |  |  |
| $\underline{\epsilon}(n) = \underline{\epsilon}_t(N)$ |  |  |
| Total | $2N^3 + 4N^2 - 1$ | $N$ |

The steps of the adaptive filtering methods according to the fourth embodiment are presented in more detail below:

Initialization:

$$W(0) = \underline{0}, \ \underline{X}(0) = \underline{0}, \ \eta(0) = \qquad \text{(Equation 58)}$$

$$\underline{0}, \ R(0) = \delta I, \ \underline{e}(0) = 0, \ \underline{P}(0) = \begin{bmatrix} 1/\delta \\ \underline{0} \end{bmatrix}$$

Processing in sampling interval n:

|  | MAC | Division |
|---|---|---|
|  |  | (Equation 59) |
| $R(n) = R(n - 1) + \underline{\xi}(n)\underline{\xi}^T(n) - \underline{\xi}(n - L)\underline{\xi}^T(n - L)$ | $2N$ |  |
| $\underline{W}(n) = \underline{W}(n - 1) + \alpha\eta_{N-1}(n - 1)\underline{X}(n - N)$ | $L$ |  |
| $y(n) = \underline{W}^T(n)\underline{X}(n) + \alpha\overline{\eta}^T(n - 1)\underline{\tilde{R}}(n)$ | $L + N - 1$ | $N$ |
| $e(n) = d(n) - y(n)$ |  |  |
| $\underline{e}(n) = \begin{bmatrix} e(n) \\ (1 - \alpha)\overline{\underline{e}}(n - 1) \end{bmatrix}$ | $N - 1$ |  |
| Solve $R(n)\underline{\epsilon}(n) = \underline{e}(n)$ for $\underline{\epsilon}(n)$ $\quad$ {N conjugate gradient iterations} | $2N^3 + 4N^2 - 1$ |  |
| $\eta(n) = \begin{bmatrix} 0 \\ \overline{\eta}(n - 1) \end{bmatrix} + \underline{\epsilon}(n)$ |  |  |
| Total | $2L + 2N^3 + 4N^2 + 4N - 3$ | $N$ | where the designations are similar to that presented with regard to the first, second and third embodiments described above. Note that any division operation in Equation (56) is not performed if the denominator is not greater than zero, in which case a zero is assigned to the quotient.

Figure 8:
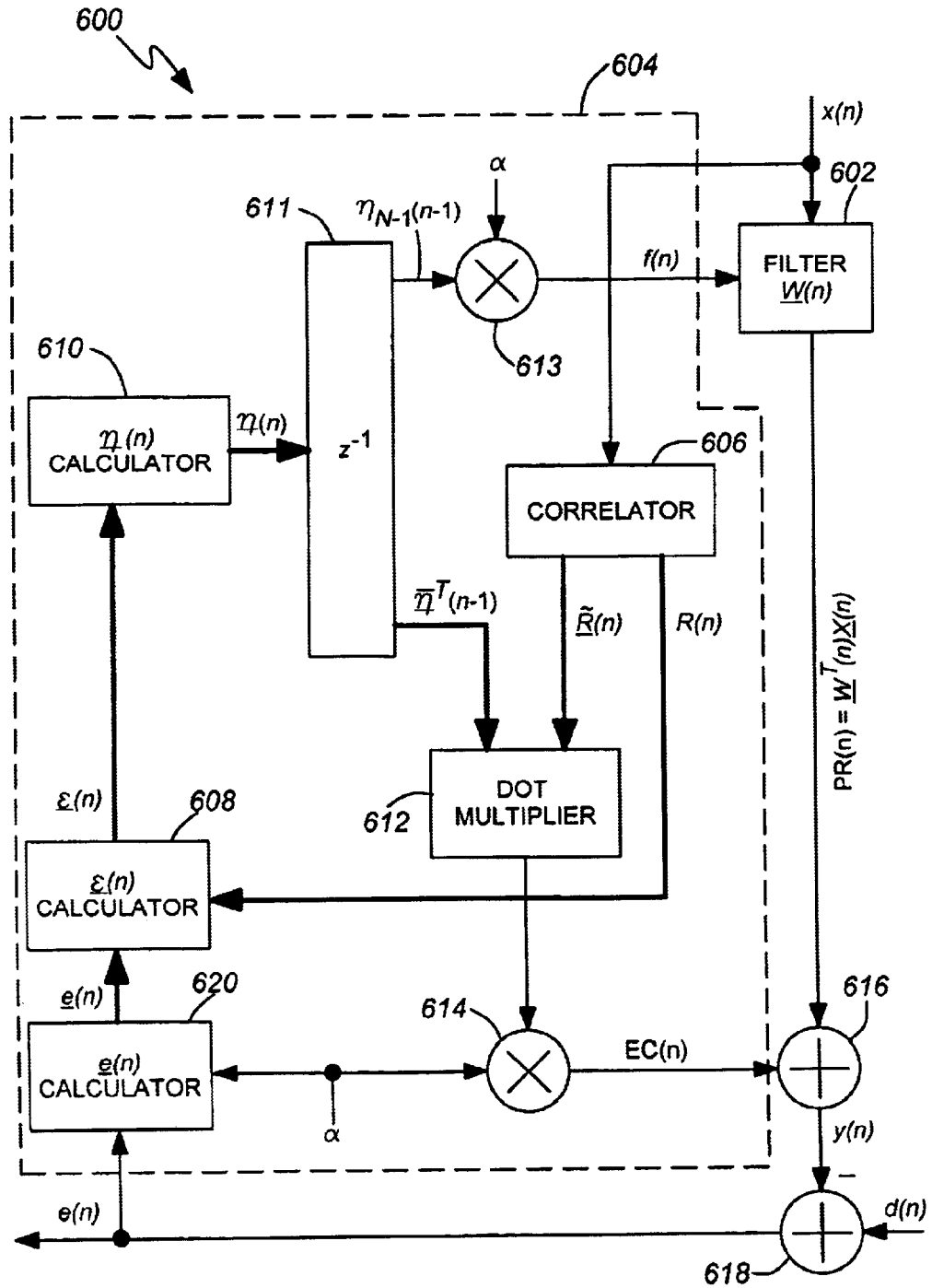
FIG. 8 is a block diagram of an adaptive filter according to a fourth embodiment of the invention.

An adaptive filter 600 according to a fourth embodiment of the invention is shown in detail in FIG. 8. It includes a filter 602 characterized by adaptive filter coefficients $\underline{W}(n)$, and means 604 for updating the coefficients, the means being set with a normalized step size a having any value in a range from 0 to 1.0. The filter 602 is a finite impulse response (FIR) filter which receives a reference input signal x(n) and an auxiliary signal f(n) used for updating the coefficients, and generates a provisional echo estimate signal PR(n). The updating means 604 includes a correlator 606 for recursively determining an auto-correlation signal presented in the form of auto-cor-relation matrix coefficients R(n) based on the reference input signal x(n), an $\underline{\epsilon}(n)$ calculator 608 and an $\underline{e}(n)$calculator 620 for corresponding calculation of vectors $\underline{\epsilon}(n)$ and $\underline{e}(n)$. The calculator 608 defines $\underline{\epsilon}(n)$ by using an iterative conjugate gradient method having an inherent stability of operation as illustrated in detail above. The projection coefficients are used within updating means 604 for generation the auxiliary filter adaptation signal f(n) and an echo estimate correction signal EC(n). The latter is used together with the provisional echo estimate PR(n) to produce the echo estimate signal y(n). In FIG. 8 thick lines represent propagation of a matrix or vector signal, i.e., the signal with more than one component, and the use of a thin line stands for a scalar signal propagation. In FIG. 8 a correlator 606 determines the autocorrelation matrix R(n) in accordance with the first formula of Eq. (59) using the current and past x(n) samples. An "$\underline{\eta}(n)$ calculator" 610 calculates $\underline{\eta}(n)$ based the last formula of Eq. (59), and as shown in FIG. 8, $\underline{\eta}(n)$ is not used by the updating means 104 until the next sampling interval. The filter 602 produces the convolutional sum $\underline{W}^T(n)\underline{X}(n)$. $\eta_{N-1}(n-1)$ is obtained from $\eta_{N-1}(n)$ by putting the latter through a unit delay element 611, providing a delay of one sampling interval, and further multiplied by the step size α in a Multiplier 613. The result is used for updating the adaptive filter coefficients (Eq. 59, second formula). $\overline{\underline{\eta}}^T(n-1)$ is dot-multiplied with part of R(n) by a Dot multiplier 612, and the result is further multiplied by a multiplier 614 with the step size α to form the correction term to be added to $\underline{W}^T(n)\underline{X}(n)$ by the summer 616 to form the filter output y(n)(Equation (59), third formula). Signals y(n) and e(n) are further sent to the $\underline{e}(n)$ calculator 620 to determine $\underline{e}(n)$ in accordance with a fourth and fifth formulae of Equation (59), and the results are sent to the $\underline{\epsilon}(n)$ calculator 608 together with the auto-correlation matrix R(n) derived in the correlator 606. The $\underline{\epsilon}(n)$ calculator 608 solves the sixth equation of Eq. (59) for $\underline{\epsilon}(n)$ by a conjugate gradient method, thus providing sufficient data for updating the adaptive filter coefficients (Eq. 6, first formula).

Figure 9:
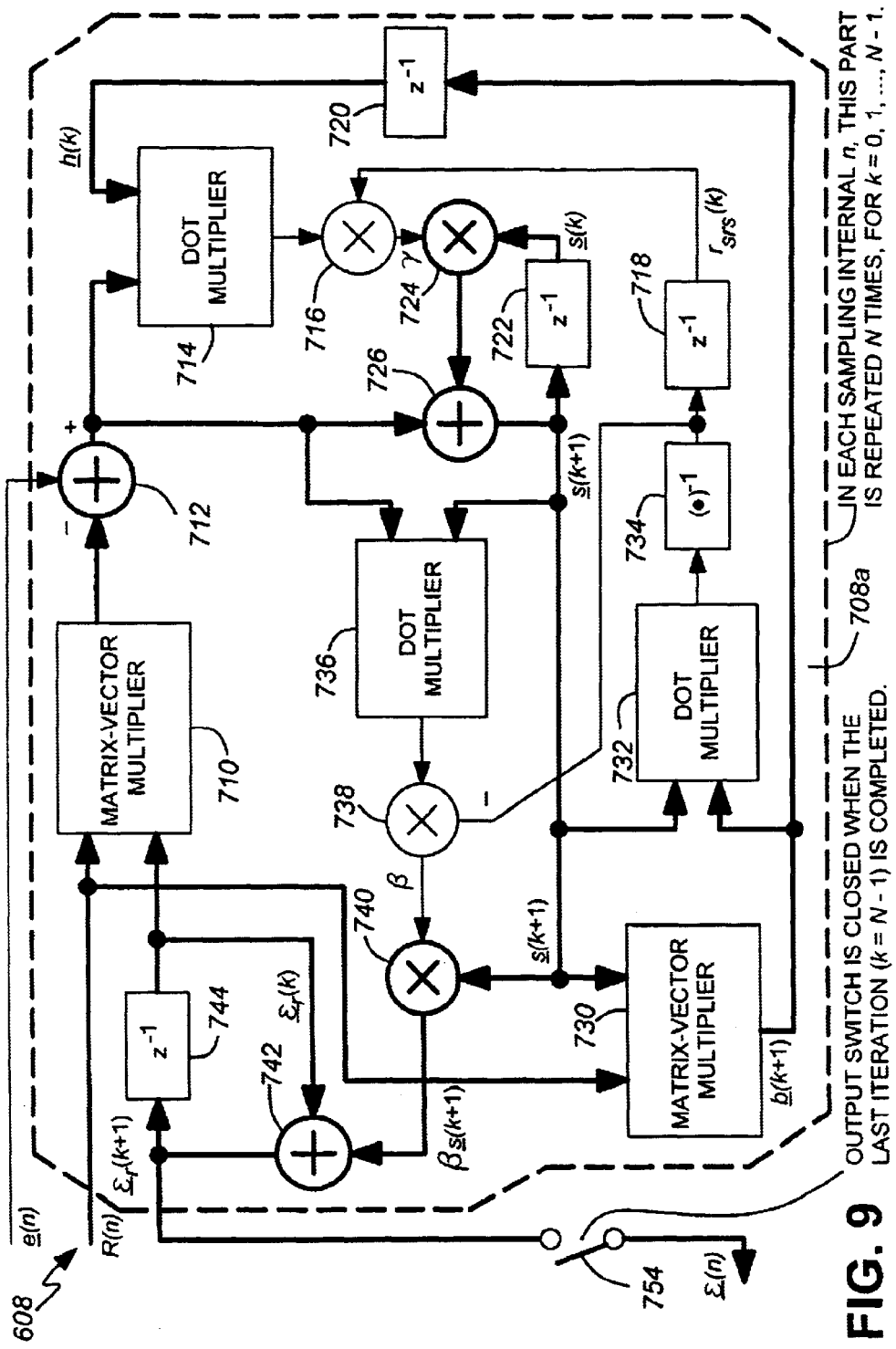
FIG. 9 is a block diagram of a conjugate gradient calculator embedded in the adaptive filter of FIG. 8.

The $\underline{\epsilon}(n)$ calculator 608, shown in detail in FIG. 9, includes a one-step calculator 708a similar to the calculator 208 of FIG. 4 and includes like elements which are referred to by the same reference numerals incremented by 500 respectively (except for P(n-1) and P(n) being replaced with $\underline{\epsilon}(n-1)$ and $\underline{\epsilon}(n)$ respectively). Thick lines represent the propagation of a matrix or vector signal, i.e., with more than one component, and the use of a thin line stands for a scalar signal propagation. At each sampling interval n, the calculator 708a performs N steps corresponding to k=0, 1, ... N-1, each step being similar to the conjugate gradient iteration performed by the filter 208 of the second embodiment of the invention. The calculator 608 additionally includes an output switch 754 which automatically opens at the beginning of the sampling interval and closes at the end of N conjugate gradient iterations.

Modifications described with regard to the first two embodiments are equally applicable to the third and fourth embodiments of the invention.

Two "C" prototypes according to the third and fourth embodiments of the invention have been implemented in a floating. point PC platform. They have demonstrated results completely consistent with the results of the first and second embodiments of the invention.

Thus, an adaptive filter and a method providing a stability of adaptive filtering based on feedback adjustment, are provided.

Although the methods operate with real-valued numbers, it does not prevent the invention from being extended to cases where introduction of complex numbers is necessary.

Although the embodiments are illustrated within the context of echo cancellation, the results are also applicable to other adaptive filtering applications.

Thus, it will be appreciated that, while specific embodiments of the invention are described in detail above, numerous variations, modifications and combinations of these embodiments fall within the scope of the invention as defined in the following claims.

What is claimed is:

1. A method of adaptive filtering using a Fast Affine Projection (FAP) adaptive filter, comprising the steps of:
    (a) determining adaptive filter coefficients;
    (b) defining a normalized step size;
    (c) updating the adaptive filter coefficients, comprising:
        determining autocorrelation matrix coefficients from a reference input signal, and
        solving a least one system of linear equations whose coefficients are the auto-correlation matrix coefficients, the system being solved using a descending iterative method having an inherent stability of its operation, the results of the solution being used for updating the adaptive filter coefficients, and the number of systems of linear equations to be solved being dependent on the normalized step size;
    (d) repeating the steps (b) and (c) the required number of times.

2. A method as defined in claim 1 wherein the step of determining auto-correlation matrix coefficients comprises calculating the auto-correlation matrix coefficients recursively.

3. A method as defined in claim 1, wherein the step of defining a normalized step size comprises setting the normalized step size not equal to unity.

4. A method as defined in claim 1, wherein the step of defining a normalized step size comprises setting the normalized step size substantially less than unity.

5. A method as defined in claim 1, wherein the step of defining a normalized step size comprises setting the normalized step size less than about 0.7.

6. A method as defined in claim 3, wherein the step of solving at least one system of linear equations comprises solving N systems of linear equations, with N being a projection order.

7. A method as defined in claim 1, wherein the step of defining a normalized step size comprises setting the normalized step size close to unity.

8. A method as defined in claim 1, wherein the step of defining a normalized step size comprises setting the normalized step size equal to unity.

9. A method as defined in claim 1, wherein the step of defining a normalized step size comprises setting the normalized step size in a range from about 0.9 to 1.0.

10. A method as defined in claim 1, wherein the step of defining a normalized step size comprises setting the normalized step size in a range from about 0.7 to 1.0.

11. A method as defined in claim 7, wherein the step of solving at least one system of linear equations comprises solving one system of linear equations only.

12. A method as defined in claim 1, wherein the step of solving the system of linear equations by a descending iterative method comprises solving the system by using a steepest descent method.

13. A method as defined in claim 1, wherein the step of solving the system of linear equations by a descending iterative method comprises solving the system by using a conjugate gradient method.

14. A method as defined in claim 1, wherein the step of solving the system of linear equations by a descending iterative method comprises solving the system by using a Newton's method.

15. A method as defined in claim 1, wherein the step of solving the system of linear equations by a descending iterative method comprises solving the system by using a PARTAN method.

16. A method as defined in claim 1, wherein the step of solving the system of linear equations by a descending iterative method comprises solving the system by using a quasi-Newton's method.

17. A method as defined in claim 1, wherein the steps are performed by operating with real value numbers.

18. A method as defined in claim 1, wherein the steps are performed by operating with complex value numbers.

19. A method as defined in claim 1, the method being used in an application selected from the group consisting of echo cancellation, noise cancellation, channel equalization and system identification.

20. A method as defined in claim 1, wherein the step of solving at least one system of linear equations comprises determining projection coefficients, the projection coefficients being the coefficients of an inverse auto-correlation matrix.

21. A method as defined in claim 20, wherein the step of determining auto-correlation matrix coefficients comprises calculating the auto-correlation matrix coefficients recursively.

22. A method as defined in claim 20, wherein the step of defining a normalized step size comprises setting the normalized step size not equal to unity.

23. A method as defined in claim 20, wherein the step of defining a normalized step size comprises setting the normalized step size substantially less than unity.

24. A method as defined in claim 20, wherein the step of defining a normalized step size comprises setting the normalized step size less than about 0.7.

25. A method as defined in claim 22, wherein the step of solving at least one system of linear equations comprises solving N systems of linear equations, with N being a projection order.

26. A method as defined in claim 25, wherein the step of solving N systems of linear equations comprises solving N systems of linear equations having decrementing orders.

27. A method as defined in claim 20, wherein the step of defining a normalized step size comprises setting the normalized step size close to unity.

28. A method as defined in claim 20, wherein the step of defining a normalized step size comprises setting the normalized step size equal to unity.

29. A method as defined in claim 20, wherein the step of defining a normalized step size comprises setting the normalized step size in a range from about 0.9 to 1.0.

30. A method as defined in claim 20, wherein the step of defining a normalized step size comprises setting the normalized step size in a range from about 0.7 to 1.0.

31. A method as defined in claim 27, wherein the step of solving at least one system of linear equations comprises solving one system of linear equations only.

32. A method as defined in claim 31, wherein determining the projection coefficients comprises calculating coefficients of a first column of the inverse auto-correlation matrix coefficients only.

33. A method as defined in claim 20, wherein the step of solving the system of linear equations by a descending iterative method comprises solving the system by using a steepest descent method.

34. A method as defined in claim 20, wherein the step of solving the system of linear equations by a descending iterative method comprises solving the system by using a conjugate gradient method.

35. A method as defined in claim 20, wherein the step of solving the system of linear equations by a descending iterative method comprises solving the system by using a Newton's method.

36. A method as defined in claim 20, wherein the step of solving the system of linear equations by a descending iterative method comprises solving the system by using a PARTAN method.

37. A method as defined in claim 20, wherein the step of solving the system of linear equations by a descending iterative method comprises solving the system by using a quasi-Newton's method.

38. A method as defined in claim 20, wherein the steps are performed by operating with real value numbers.

39. A method as defined in claim 20, wherein the steps are performed by operating with complex value numbers.

40. A method as defined in claim 20, the method being used in an application selected from the group consisting of echo cancellation, noise cancellation, channel equalization and system identification.

41. An adaptive filter comprising:
   a Fast Affine Projection (FAP) adaptive filter characterized by adaptive filter coefficients;
   a means for updating the adaptive filter coefficients, including means for setting a normalized step size, the updating means comprising:
      a correlator for determining auto-correlation matrix coefficients from a reference input signal, and
      a calculator for solving at least one system of linear equations whose coefficients are the auto-correlation matrix coefficients, the system being solved by using a descending iterative method having an inherent stability of its operation, the results of the solution being used for updating the adaptive filter coefficients and the number of systems of linear equations to be solved being dependent on the normalized step size.

42. The adaptive filter as defined in claim 41, wherein the correlator is a recursive correlator.

43. The adaptive filter as defined in claim 41, wherein the normalized step size is not equal to unity.

44. The adaptive filter as defined in claim 41, wherein the normalized step size is substantially less than unity.

45. The adaptive filter as defined in claim 41, wherein the normalized step size is less than about 0.7.

46. The adaptive filter as defined in claim 43, wherein the calculator includes means for solving N systems of linear equations, with N being a projection order.

47. The adaptive filter as defined in claim 41, wherein the normalized step size is close to unity.

48. The adaptive filter as defined in claim 41, wherein the normalized step size is equal to unity.

49. The adaptive filter as defined in claim 41, wherein the normalized step size is within a range from about 0.9 to 1.0.

50. The adaptive filter as defined in claim 41, wherein the normalized step size is within a range from about 0.7 to 1.0.

51. The adaptive filter as defined in claim 47, wherein the calculator provides solution of one system of linear equations only.

52. The adaptive filter as defined in claim 41, wherein the calculator is a calculator providing solution of the system of linear equations according to a steepest descent method.

53. The adaptive filter as defined in claim 41, wherein the calculator is a calculator providing solution of the system of linear equations according to a conjugate gradient method.

54. The adaptive filter as defined in claim 41, wherein the calculator is a calculator providing solution of the system of linear equations according to a Newton's method.

55. The adaptive filter a defined in claim 41, wherein the calculator is a calculator providing solution of the system of linear equations according to a PARTAN method.

56. The adaptive filter as defined in claim 41, wherein the calculator is a calculator providing solution of the system of linear equations according to a quasi-Newton's method.

57. The adaptive filter as defined in claim 41 capable of operating with real value numbers.

58. The adaptive filter as defined in claim 41 capable of operating with complex value numbers.

59. The adaptive filter as defined in claim 41 for use in an application selected from the group consisting of echo cancellation, noise cancellation, channel equalization and system identification.

60. The adaptive filter as defined in claim 41, wherein the calculator further comprises means for determining projection coefficients, the projection coefficients being the coefficients of an inverse auto-correlation matrix.

61. The adaptive filter as defined in claim 60, wherein the correlator is a recursive correlator.

62. The adaptive filter as defined in claim 60, wherein the normalized step size is not equal to unity.

63. The adaptive filter as defined in claim 60, wherein the normalized step size is substantially less than unity.

64. The adaptive filter as defined in claim 60, wherein the normalized step size is less than about 0.7.

65. The adaptive filter as defined in claim 62, wherein the calculator is capable of solving N systems of linear equations, with N being a projection order.

66. The adaptive filter as defined in claim 65, wherein the calculator is capable of solving N systems of linear equations having decrementing orders.

67. The adaptive filter as defined in claim 60, wherein the normalized step size is close to unity.

68. The adaptive filter as defined in claim 60, wherein the normalized step size is equal to unity.

69. The adaptive filter as defined in claim 60, wherein the normalized step size is within a range from about 0.9 to 1.0.

70. The adaptive filter as defined in claim 60, wherein the normalized step size is within a range from about 0.7 to 1.0.

71. The adaptive filter as defined in claim 67, wherein the calculator is suitable for solving one system of linear equations only.

72. The adaptive filter as defined in claim 71, wherein the means for determining projection coefficients provides calculation of coefficients of a first column of the inverse auto-correlation matrix coefficients only.

73. The adaptive filter as defined in claim 60, wherein the calculator is a calculator providing solution of the system of linear equations according to a steepest descent method.

74. The adaptive filter as defined in claim 60, wherein the calculator is a calculator providing solution of the system of linear equations according to a conjugate gradient method.

75. The adaptive filter as defined in claim 60, wherein the calculator is a calculator providing solution of the system of linear equations according to a Newton's method.

76. The adaptive filter as defined in claim 60, wherein the calculator is a calculator providing solution of the system of linear equations according to a PARTAN method.

77. The adaptive filter as defined in claim 60, wherein the calculator is a calculator providing solution of the system according to a quasi-Newton's method.

78. The adaptive filter as defined in claim 60 capable of operating with real value numbers.

79. The adaptive filter as defined in claim 60 capable of operating with complex value numbers.

80. The adaptive filter as defined in claim 60 for use in an application selected from the group consisting of echo cancellation, noise cancellation, channel equalization and system identification.

* * * * *